United States Patent
Yamauchi et al.

(10) Patent No.: US 6,534,380 B1
(45) Date of Patent: Mar. 18, 2003

(54) SEMICONDUCTOR SUBSTRATE AND METHOD OF MANUFACTURING THE SAME

(75) Inventors: Shoichi Yamauchi, Obu (JP); Hisayoshi Ohshima, Obu (JP); Masaki Matsui, Nagoya (JP); Kunihiro Onoda, Nagoya (JP); Tadao Ooka, Aichi-gun (JP); Akitoshi Yamanaka, Hekinan (JP); Toshifumi Izumi, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/116,956

(22) Filed: Jul. 17, 1998

(30) Foreign Application Priority Data

| Jul. 18, 1997 | (JP) | 9-194163 |
| Jul. 25, 1997 | (JP) | 9-199973 |
| Oct. 9, 1997 | (JP) | 9-277613 |
| May 28, 1998 | (JP) | 10-147939 |

(51) Int. Cl.$^7$ .......................... H01L 21/30; H01L 21/46

(52) U.S. Cl. ................ 438/455; 438/139; 438/770; 438/691; 438/960

(58) Field of Search .................. 438/455, 458, 438/149, 406, 409, 967, 150, 407, 960, 459, 691, 692, 959, 977, 770

(56) References Cited

U.S. PATENT DOCUMENTS

| 4,179,324 A | * | 12/1979 | Kirkpatrick | 156/230 |
| 5,374,564 A | * | 12/1994 | Bruel | 437/24 |
| 5,494,835 A | * | 2/1996 | Bruel | 437/24 |
| 5,494,846 A | * | 2/1996 | Yamakazi | 437/62 |
| 5,559,043 A | | 9/1996 | Bruel | 437/24 |
| 5,616,506 A | * | 4/1997 | Takemura | 438/150 |
| 5,695,557 A | * | 12/1997 | Yamagata et al. | 117/97 |
| 5,714,395 A | * | 2/1998 | Bruel | 437/24 |
| 5,723,372 A | | 3/1998 | Campisano et al. | 438/164 |
| 5,854,123 A | * | 12/1998 | Sato et al. | 438/507 |
| 5,863,830 A | * | 1/1999 | Bruel et al. | 438/478 |
| 5,882,987 A | * | 3/1999 | Srikrishnan | 438/458 |
| 5,993,677 A | * | 11/1999 | Biasse et al. | 216/36 |
| 6,020,252 A | * | 2/2000 | Aspar et al. | 438/458 |
| 6,121,112 A | * | 9/2000 | Sakaguchi et al. | 438/406 |
| 6,156,624 A | * | 12/2000 | Yamagata et al. | 438/459 |
| 6,194,245 B1 | * | 2/2001 | Tayanaka | 438/57 |
| 6,225,192 B1 | * | 5/2001 | Aspar et al. | 438/460 |

FOREIGN PATENT DOCUMENTS

| EP | 767486 | 4/1997 |
| JP | 1-302837 | 12/1989 |
| JP | 5-74762 | * 3/1993 |
| JP | 5-211128 | 8/1993 |
| JP | 7-94741 | 4/1995 |
| JP | 7-302889 | 11/1995 |
| JP | 9-181011 | 7/1997 |
| JP | 9-213594 | 8/1997 |

OTHER PUBLICATIONS

Bruel et al.; "Smart cut": a promising new SOI material technology; pp. 178–179; SOI Conference, 1995; Oct. 1995.*

(List continued on next page.)

Primary Examiner—Long Pham
Assistant Examiner—Fernando Toledo
(74) Attorney, Agent, or Firm—Harness, Dickey & Pierce, PLC

(57) ABSTRACT

Before a semiconductor substrate and a base substrate is directly bonded to one another, in a protective film removing step, a contamination protective film formed on the semiconductor substrate to protect it from contamination during an ion implanting step is removed. Consequently, even when flatness of the contamination protective film is degraded during the ion implanting step or even when contaminants remain in a segregated state in the vicinity of the surface of the contamination protective film, the state of the bonding between the semiconductor substrate and the base substrate after the bonding step can be made uniform over the entire area of the bonding. As a result, a high-quality semiconductor substrate can be manufactured at low cost.

23 Claims, 14 Drawing Sheets

OTHER PUBLICATIONS

Auberton–Herve, A.J.; SOI: material systems; pp. 3–10; Electron Devices Meeting 1996; Dec. 1996.*

Wolf and Tauber, Silicon Processing for the VLSI Era: vol. 1, 1986, Lattice Press, pp. 555–556.*

Wolf, Silicon Processing for the VLSI Era: vol. 2, 1990, Lattice Press, pp. 238–239.*

Moriceau et al, "Cleaning and Polishing As Key Steps For Smart–Cut® SOI Process", Proceedings 1996 IEEE International SOI Conference, Oct. 1996, pp. 152–153.

Conley Jr. et al, "Electron Spin Resonance Characterization of Unibond® Material", Proceedings 1996 IEEE International SOI Conference, Oct. 1996, pp. 164–165.

Aspar et al, "Transfer of structured and patterned thin silicon films using the Smart–Cut® process", Electronics Letters, vol. 32, No. 21, Oct. 10, 1996, pp. 1985–1986.

Hara et al, "Ion Implantation and Annealing Conditions for Delamination of Silicon Layers by Hydrogen Ion Implantation", Journal of the Electrochemical Society, vol. 144, No. 4, Apr. 1997, pp. L78–L81.

Tong et al, "Layer splitting process in hydrogen–implanted Si, Ge, SiC, and diamond substrates", Applied Physics Letters, vol. 70, No. 11, Mar. 17, 1997, pp. 1390–1392.

Auberton–Herve and Hyodo, "Unibord SOI wafer due to Smart Cut", Electronic Material, Jun. 1997, pp. 29–33.

Bruel et al, "®"Smart Cut": A Promising New SOI Material Technology", Proceedings 1995 IEEE International SOI Conference, Oct. 1995, pp. 178–179.

M. Bruel, "Silicon on insulator material technology", Electronics Letters, vol. 31, No. 14, Jul. 6, 1995, pp. 1201–1202.

Aspar et al, "Basic mechanisms involved in the Smart–Cut® process", Microelectronic Engineering 36, (1997), pp. 233–240.

Bruel et al, "Unibond® SOI Wafers Achieved by Smart–Cut® Process", (name of article, date, page number: not available).

Ohmi, Tadahiro, "Future of Semiconductor Technology", J. IEE Japan, vol. 117, No. 2, pp. 88–93.

Maleville et al, "Wafer bonding and H–implantation mechanisms involved in the Smart–cut® technology", Materials Science & Engineering B46, 1997, pp. 14–19.

Hara et al, "Delaminations of Thin Layers by High Dose Hydrogen Ion Implantation in Silicon", Journal of The Electrochemical Society, vol. 143, No. 8, Aug. 1996, pp. L166–L168.

M. Bruel, "Silicon on insulator material technology", IEE, May 24, 1995.

Auberton–Herve et al, "A New SOI Material :Smart–Cut®", (name of article, date, page number; not available).

Aspar et al, "Smart–Cut®: The basic fabrication process for Unibond® SOI wafers", (name of article, date, page number: not available).

Bruel et al, "Smart–Cut: A New S.O.I. Material Technology Based on Hydrogen Implantation and Wafer Bonding", Extended Abstracts of the 1996 International Conference on Solid State Devices and Materials, Yokohama, 1996, pp. 458–460.

Auberton–Herve et al, "SOI Materials for ULSI Applications", (name of article, date, page number: not available).

Nakajima et al, "Behavior of blister formation in helium and hydrogen 2 step implanted silicon wafers", Applied Physics Academy Symposium Preliminary Reports, Oct. 1997, 3p–PB–2, pp. 818.

Takada et al, "In–situ observation of "Smart–Cut®" by Thermal Desorption Spectroscopy (2) –dose dependence of splitting temperature–", Applied Physics Academy Symposium Preliminary Reports, Oct. 1997, 3p–PB–3, pp. 819.

Takada et al, "In–situ observation of "Smart–Cut" by Thermal Desorption Spectroscopy [Experimental Method]", Applied Physics Academy Symposium Preliminary Reports, Mar. 1997, 29p–G–11, pp. 739, Oct. 1996, pp 150–151.

Hara et al, "H+ Implantation in Si for The Void Cut SOI Manufacturing", IEEE, 1997, pp. 45–48.

Lee et al, "A Novel Pattern Transfer Process for Bonded SOI Giga–bit DRAMs", IEEE International SOI Conference, Oct. 1996, pp. 114–115.

Bruel et al, "Smart–Cut: A New Silicon On Insulator Material Technology Based on Hydrogen Implantation and Wafer Bonding", Japanese Journal of Applied Physics, vol. 36, Mar. 1997, pp. 1636–1641.

Liu et al, "Effect of Total Dose Radiation on FETs Fabricated in Unibond™ SOI Material", Proceedings 1996 IEEE International SOI Conference, Oct. 1996, pp. 94–95.

Kuehne et al, "Deep Sub–Micron SOI MOSFET With Buried Body Strap", Proceedings 1996 IEEE International SOI Conference, Oct. 1996, pp. 96–97.

Yang et al, "Silicon–on–Insulator–with–Active–Substrate (SOIAS) Technology", Proceedings 1996 IEEE International SOI Conference, Oct. 1996, pp. 106–107.

Weldon et al, "Mechanistic Studies of Hydrophilic Wafer Bonding and Si Exfoliation for SOI Fabrication", Proceedings 1996 IEEE International SOI Conference, Oct. 1996, pp. 150–151.

* cited by examiner (ION IMPLANTATION)

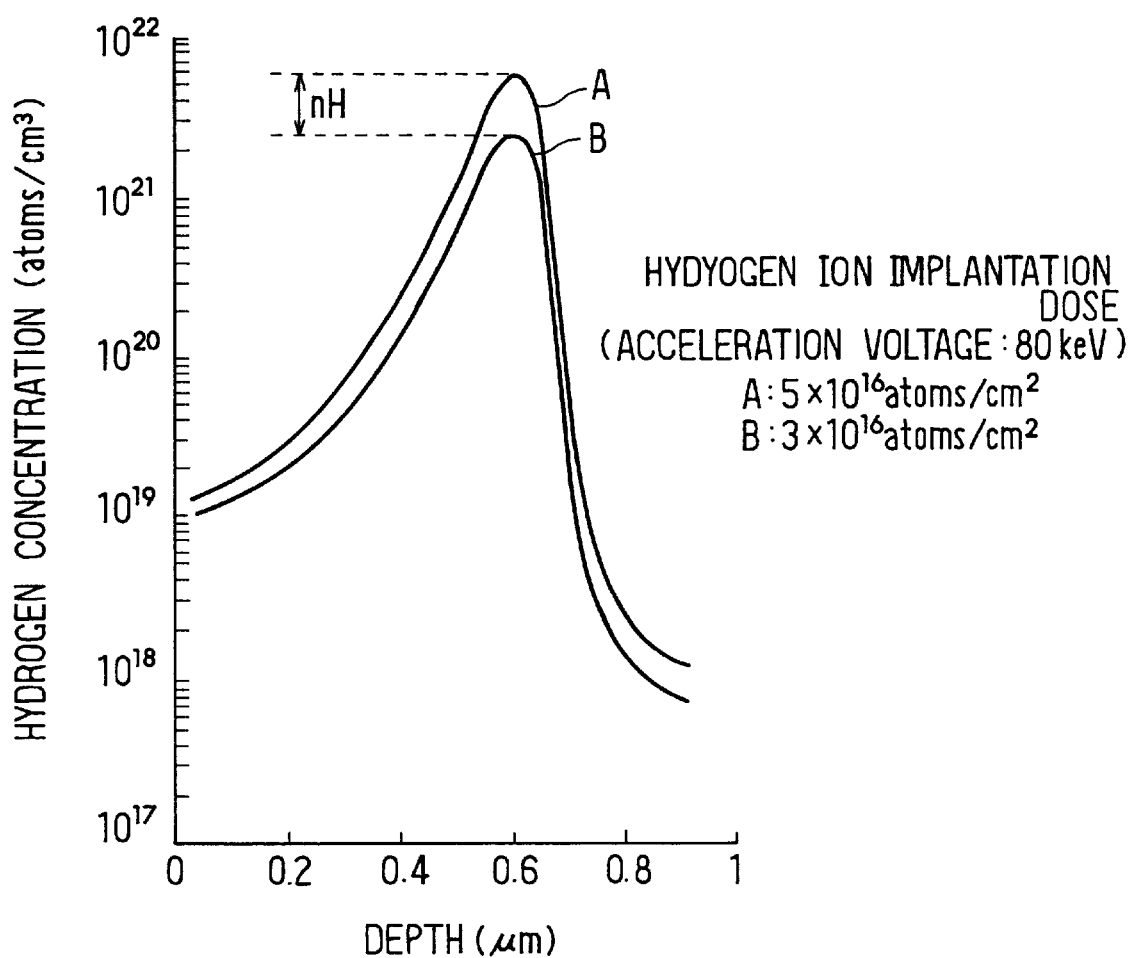

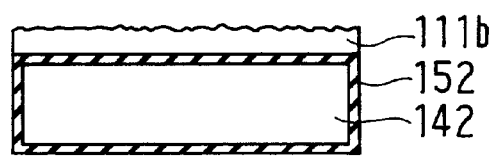

US 6,534,380 B1

SEMICONDUCTOR SUBSTRATE AND METHOD OF MANUFACTURING THE SAME

CROSS REFERENCE TO RELATED APPLICATIONS

This application is based upon and claims the benefit of priority of the prior Japanese Patent Application No. 9-194163, filed on Jul. 18, 1997, No. 9-199973, filed on Jul. 25, 1997, No. 9-277613 filed on Oct. 9, 1997, and No. 10-147939 filed on May 28, 1998, the contents of which are incorporated herein by reference.

BACKGROUND OF THE INVENTION

1. Field of the Invention

This invention relates to a semiconductor substrate having a semiconductor layer for device formation provided on a base substrate in such a state that the semiconductor layer is electrically insulated from the base substrate, and to a method for manufacturing the semiconductor substrate.

2. Description of the Related Art

A semiconductor substrate of this kind includes for example an SOI (Silicon On Insulator) substrate wherein an oxide film for insulation is formed on a silicon substrate and a single crystal (monocrystalline) silicon film is formed on the oxide film as a semiconductor layer. When this kind of semiconductor substrate is used, it is unnecessary to separately conduct a step for isolating the semiconductor layer from the substrate, the isolation performance is improved, and it is possible to form devices in the single crystal silicon film at a high integrated density to make an integrated circuit.

As a method for manufacturing the single crystal silicon film of the SOI structure, various methods have been proposed. For example JP-A-5-211128 discloses a semiconductor thin film manufacturing method wherein the single crystal silicon film is manufactured in three steps. This manufacturing method will now be described with reference to FIGS. 1A–1D.

In a first step, as shown in FIG. 1A, ions of hydrogen gas or noble gas are implanted into a semiconductor substrate material 1 through a contamination protective film 1a formed on an upper face of the semiconductor substrate material 1. An ion-implanted region 2 in which implanted ions are distributed is thus formed at a predetermined depth in the semiconductor substrate material 1. In a second step, as shown in FIG. 1B, a base substrate 3 made of at least one rigid material is joined to the ion implantation side face of the semiconductor substrate material 1 by bonding or the like. Here, a substrate made of a semiconductor material can be used as the base substrate 3, and to eventually form an SOI substrate, preferably an insulating film 4 such as an oxide film is formed on the base substrate 3 before the base substrate 3 is joined to the semiconductor substrate material 1.

As a third step, heat treatment is carried out on the semiconductor substrate material 1 and the base substrate 3 thus joined together, so that a thin film part is detached from the semiconductor substrate material 1. The boundary of the detachment is a micro-void (minute bubbles) part formed in the ion-implanted region 2. Accordingly, as shown in FIG. 1C, an SOI substrate 6 consisting of a single crystal silicon film 5 bonded to the base substrate 3 with the insulating film 4 therebetween is formed. In practice, because the detachment face of the single crystal silicon layer 5 has surface steps of several nm in size and a defective layer thereon, the detachment face is polished or etched to be flattened. At the same time, the thickness of the single crystal silicon film 5 is controlled to be a predetermined thickness (for example 0.1 μm), thereby finishing the SOI substrate 6 as shown FIG. 1D.

However, when the SOI substrate 6 is manufactured by the steps described above, in practice the following problem may arise. That is, as shown in FIG. 2, in the heat treatment of the third step mentioned above, when the detachment phenomenon at the above-mentioned micro-void part occurs, the surface portion of the semiconductor substrate material 1, which is supposed to form the single crystal silicon film 5 bonded to the base substrate 3, is liable to partially remain on the semiconductor substrate material 1. In FIG. 2, the remaining parts are shown with letter Q. As a result, an unevenly detached silicon layer is bonded to the base substrate 3, resulting in a significant reduction in the quality and deterioration of yield of the SOI substrate 6. Although because of drawing restrictions the phenomenon of the remaining parts Q arising is schematically shown in FIG. 2, the remaining parts are actually produced in many locations distributed over the entire area of the semiconductor substrate material 1.

It can be supposed that this kind of phenomenon occurs because the bonding of the semiconductor substrate material 1 to the base substrate 3 is not effected uniformly over the entire region of the bonding. Such bonding defects may be caused, for example, by flatness of the contamination protective film 1a on the semiconductor substrate material 1 being degraded by the ion implanting step, or by contaminants remaining in the vicinity of the surface of the contamination protective film 1a in a segregated state. When such bonding defects exist, even when the kind of phenomenon shown in FIG. 2 does not occur, the bonding strength between the base substrate 3 and the single crystal silicon flim 5 may be insufficient, and this can cause the insufficient reliability of the SOI substrate 6.

Further, in the above mentioned method, the semiconductor substrate material 1 and the base substrate 3 are made of the same material so as to prevent warps from occurring to the bonded semiconductor substrate material 1 and the base substrate 3 bonded together due to a difference in thermal expansion coefficient therebetween. However, in this case, it is necessary for both of the semiconductor substrate material 1 and the base substrate 3 to be made from a high quality single crystal silicon, resulting in increase in cost. Additionally, the method, especially the third step, necessitates relatively long time, and this also results in increase in cost.

SUMMARY OF THE INVENTION

The present invention is made in view of the above problems. A first object of the present invention is to provide a semiconductor substrate including a semiconductor layer bonded to a base substrate in an insulated state from the base substrate with a sufficient bonding strength and with good yield. A second object of the present invention is to provide a method for manufacturing a high-quality semiconductor substrate including a semiconductor layer bonded to a base substrate in an insulated state from the base substrate at low cost.

To achieve a first object of the present invention, a semiconductor substrate of the present invention is manufactured such that a semiconductor layer is bonded to a base substrate through a natural oxide layer. Accordingly, the bonding strength between the base substrate and the semiconductor layer increases. Alternatively or additionally, before the base substrate is bonded to a semiconductor substrate material and before a ion-implanted layer is formed in the semiconductor substrate material, a contamination protective layer may be formed on the semiconductor substrate material. In this case, ions are implanted into the semiconductor substrate material through the contamination protective layer to form the ion-implanted layer, and at least a part of the contamination protective layer is removed before the base substrate and the semiconductor substrate material are bonded to one another. Accordingly, even when the flatness of the contamination protective layer is degraded by ion-implantation or even when contaminants remain in the vicinity of the surface region of the contamination protective layer, the bonding state can be made uniform over the entire bonding area. Therefore, the semiconductor layer can be detached from the semiconductor substrate material along with the base substrate without partially remaining on the semiconductor substrate material, so that the yield of the semiconductor substrate is improved.

Preferably, before the base substrate and the semiconductor substrate material are detached from one another at the ion-implanted layer by a heat treatment, another heat treatment is carried out at a temperature lower than that of the heat treatment for detaching not to cause the detachment of the base substrate and the semiconductor substrate material. More preferably, after the heat treatment for detaching is carried out, another heat treatment is carried out at a temperature higher than that of the heat treatment for detachment. Accordingly, the bonding strength between the base substrate and the semiconductor layer is further increased.

To achieve a second object of the present invention, a semiconductor substrate of the present invention includes a base substrate that holds a monoclystalline semiconductor layer thereon via an insulating layer and has a quality inferior to that of the single crystal semiconductor layer. Accordingly, the semiconductor substrate can be manufactured at low cost. The semiconductor substrate can be manufactured by bonding the base substrate to a semiconductor substrate material and detaching the base substrate from the semiconductor substrate material along with the semiconductor layer at a defective layer. In this case, the quality of the base substrate is inferior to that of the semiconductor substrate material, and the semiconductor substrate material can be repeatedly used for forming other semiconductor substrates after the detachment. Therefore, this method can provide cost reduction and good performance in mass production.

Also, according to the present invention, to achieve the second object, first and second ion-implanted layers may be formed in a semiconductor substrate material at first and second depths different from one another. In this case, first and second base substrates are bonded to both surfaces of the semiconductor substrate material. Then, the first and second substrates are detached from the semiconductor substrate material at the first and second ion-implanted layers, respectively along with the first and second semiconductor layers by a heat treatment. Accordingly, two semiconductor substrates are provided only by one heat-treatment for detachment, resulting in low manufacturing cost. The semiconductor substrate material from which the first and second semiconductor layers are removed can be also reused to manufacture other semiconductor substrates.

BRIEF DESCRIPTION OF THE DRAWINGS

The present invention will become more fully understood from the detailed description given herebelow and the accompanying drawings which are given by way of illustration only and are not intended to limit the present invention, and wherein:

FIG. 5 is a characteristic chart showing relationships between a hydrogen ion implantation depth and a hydrogen concentration in the first embodiment;

DETAILED DESCRIPTION OF THE PREFERRED EMBODIMENTS

First Embodiment

A first preferred embodiment of the present invention will now be described with reference to FIGS. 3A through 3K.

Figure 3A:
FIGS. 3A–3K are cross-sectional views schematically showing a manufacturing process for forming a semiconductor substrate in a stepwise manner in a first preferred embodiment.

First, in a protective film forming step shown in FIG. 3A, a contamination protective film 12 made of a silicon oxide with a uniform thickness is formed on for example a single crystal silicon substrate (semiconductor substrate material) 11 by thermal oxidation or by a deposition method such as a chemical vapor deposition (CVD) method or a physical vapor deposition (PVD) method. The contamination protective film 12 is for preventing the single crystal silicon substrate 11 from being contaminated by heavy metals and the like in an ion-implanting step which is discussed below, and its thickness is preferably set to approximately 50 nm to 100 nm.

Figure 3B:
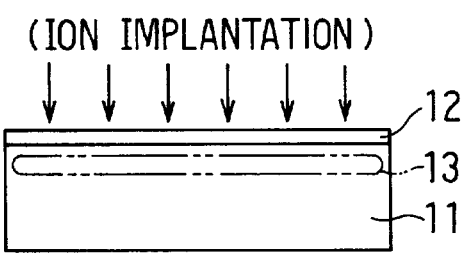

After that, in the ion-implanting step shown in FIG. 3B, hydrogen gas ions or noble gas ions are implanted into the single crystal silicon substrate 11 through the contamination protective film 12 as shown with arrows in the drawing, so that an ion-implanted layer 13 parallel with the surface of the single crystal silicon substrate 11 is formed inside the single crystal silicon substrate 11. The dose in this ion-implanting step, in the case of hydrogen gas ions, is set to more than $1 \times 10^{16}$ atoms/cm$^2$ and preferably more than $5 \times 10^{16}$ atoms/cm$^2$. The ion implantation energy is set in accordance with the depth at which the ion-implanted layer 13 is to be formed. As the implanted ions, besides hydrogen and noble gases, it is conceivable to use ions of any of various other gases such as oxygen, chlorine, and fluorine.

Figure 3C:
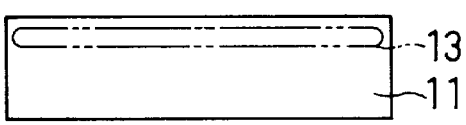

In a protective film removing step shown in FIG. 3C, the contamination protective film 12 on the single crystal silicon substrate 11 is entirely removed by for example chemical etching using aqueous hydrofluoric acid. The removal of the contamination protective film 12 can alternatively be carried out by mechanical polishing or dry etching.

Figure 3D:
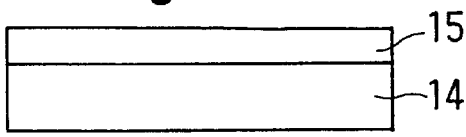

In an insulating film forming step shown in FIG. 3D, an insulating film 15 made of silicon oxide and having a uniform thickness is formed on a base substrate 14 made of for example single crystal silicon by thermal oxidation or by a deposition method such as a CVD method or a PVD method. When an SOI substrate is finally formed, the insulating film 15 serves as a buried oxide film, and its thickness is set to a value according to the design shape of the SOI substrate.

Figure 3E:
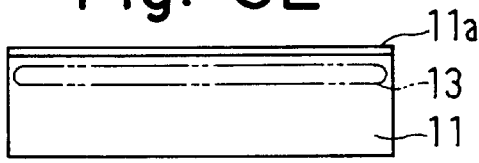
Figure 3F:
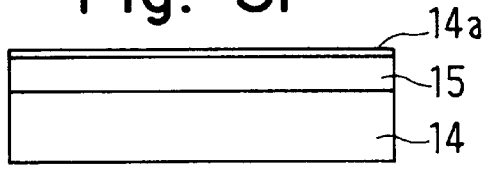

In a hydrophilizing step shown in FIGS. 3E, 3F, a hydrophilizing treatment is carried out on the ion implantation side surface of the single crystal silicon substrate 11 and the surface of the insulating film 15. Specifically, in the hydrophilizing treatment, for example the surfaces of the single crystal silicon substrate 11 and the insulating film 15 are washed for approximately 20 min. using a mixture of sulfuric acid and hydrogen peroxide water ($H_2SO_4$:$H_2O_2$= 4:1) held at a temperature of approximately 90° C. to 120° C. and then are rinsing with pure water. As a result, natural oxide films 11a, 14a are formed respectively on the ion implantation side surface of the single crystal silicon substrate 11 and the surface of the insulating film 15.

Figure 3G:
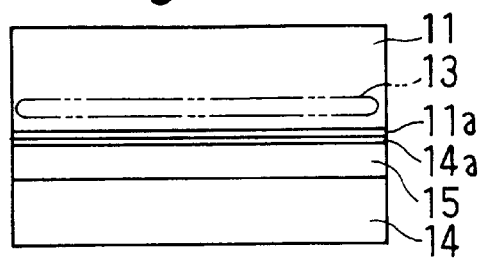

Next, in a bonding step shown in FIG. 3G, the single crystal silicon substrate 11 and the base substrate 14 are bonded together at their hydrophilized faces via the natural oxide films 11a, 14a. At that time, the bonding is effected by a direct bonding action provided by hydrogen bonding of silanol radicals and water molecules present on the hydrophilized faces of the substrates 11, 14.

Figure 3H:
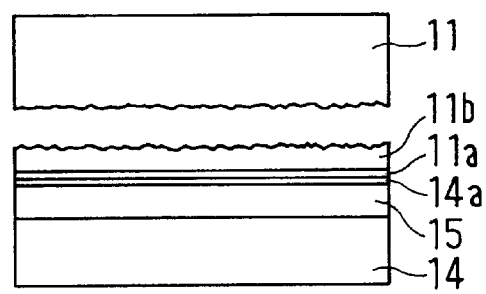
Figure 3I:
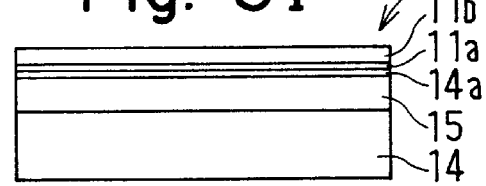

After that, in a detaching step shown in FIG. 3H, a heat treatment is carried out on the single crystal silicon substrate 11 and the base substrate 14 thus integrated, so that the single crystal silicon substrate 11 is detached at a defective part formed in the ion-implanted layer 13. In this way, an SOI structure wherein a single crystal silicon thin film (semiconductor layer) 11b is stacked on the base substrate 14 via the insulating film 15 is manufactured.

In this case, specifically, in the case that the ion-implanted layer 13 is formed by implanting hydrogen ions therein, the heat treatment is preferably carried out at approximately 400° C. to 600° C. During the heat treatment, it is considered that minute bubbles consisting of hydrogen gas, i.e., non-bonded hydrogen, agglomerate to form microvoids at the defective part formed in the ion-implanted layer 13, and the gas inside the microvoids expands to cause the detachment at the defective part. This detachment mechanism is disclosed by for example Xiang Lu, et al., "Hydrogen induced silicon surface layer cleavage", Appl. Phys. Lett. 71(13), 29 September, pp. 1804–1806.

To allow the single crystal silicon substrate 11 to be detached in the above mentioned way, it is necessary to secure a bonding strength between the single crystal silicon substrate 11 and the base substrate 14 sufficient to withstand the stress caused by the expansion of gas inside the above-mentioned microvoids produced in the heat treatment step.

In the bonding step, generally, after the single crystal silicon substrate 11 and the base substrate 14 are bonded to each other at room temperature, a heat treatment is carried out to strengthen the bonding state betweent the two substrates 11, 14. For example, Takao Abe et al., "The Role of Hydrogen Bonding in Bonding of Silicon and Quartz Wafers", SDM90-156, 1990, Japan Electrical Information and Communications Association, and Takao Abe et al., "Silicon Wafer Bonding Mechanism for Silicon-on-insulator Structures", Japanese Journal of Appl. Phys. Vol 29, No. 12, December, 1990, pp. L2311–L2314 and the like teach that the bonding strength is increased by a heat treatment at a high temperature for a long period.

Figure 4:
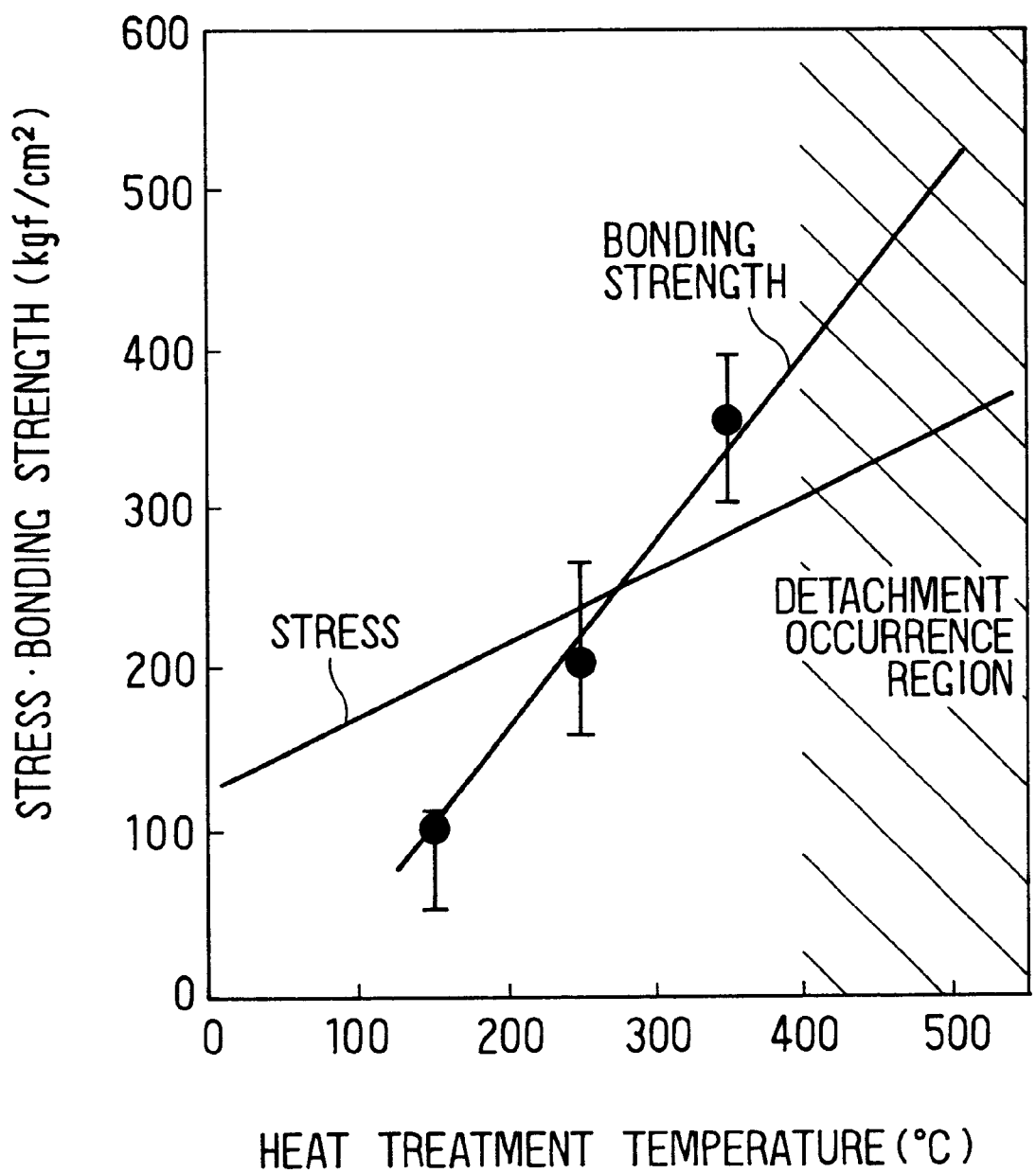
FIG. 4 is a characteristic chart showing relationships between a heat treatment temperature and a bonding strength in the semiconductor substrate and between the heat treatment temperature and a stress generated by hydrogen gas expansion in the first embodiment.

FIG. 4 shows results of experiments indicating the bonding strength characteristics between the single crystal silicon substrate 11 and the base substrate 14 with respect to the heat treatment temperature. Specifically, a plurality of samples each made up of the bonded substrates 11, 14 shown in FIG. 3G were prepared. After the samples were heated respectively at for example 150° C., 250° C., or 350° C. for 30 min., the bonding strength between the substrates 11, 14 of each sample was measured. As understood from FIG. 4, it can be seen that the bonding strength increases with the increase in the heat treatment temperature.

The bonding strength between the single crystal silicon substrates 11 and the base substrate 14 bonded by the bonding step shown in FIG. 3G can be strengthened by the heat treatment, and the detachment phenomenon occurs approximately at a temperature in a range of 400° C.–600° C. in the detaching step shown in FIG. 3H. As mentioned above, it is considered that the detachment phenomenon is caused by the microvoids consisting of hydrogen gas. That is, the hydrogen gas inside the microvoids expands by the heat treatment, so that stress is produced in the ion-implanted layer 13, and the stress causes the detachment in the single crystal silicon substrate 11.

In this case, when the generally-used equation of state of an ideal gas is used, stress P caused by the hydrogen gas expansion in the ion-implanted layer 13 can be expressed with respect to heat treatment temperature T by the following equation (1):

$$P = R \cdot nH \cdot T / N_A \text{ (kgf/cm}^2\text{)} \tag{1}$$

in which R is the gas constant (84.7833 cm$^3$·kgf/cm$^2$·mol$^{-1}$·K$^{-1}$), nH is the hydrogen concentration and NA is Avogadro's number (6.022045×10$^{23}$mol$^{-1}$).

On the other hand, it is experimentally confirmed when an acceleration voltage is 80 KeV, a hydrogen ion implantation dose necessary for causing the above mentioned detachment phenomenon is $3 \times 10^{16}$ atms/cm$^2$–$4 \times 10^{16}$ atms/cm$^2$ at least. That is, the threshold value for causing the detachment phenomenon when the acceleration voltage is 80 KeV falls within the range of $3 \times 10^{16}$ atms/cm$^2$–$4 \times 10^{16}$ atms/cm$^2$.

FIG. 5 shows distributions of hydrogen implanted into the single crystal silicon substrate, which were detected by secondary ion mass spectroscopy (SIMS). Two samples in which the hydrogen ion implantation doses were $5 \times 10^{16}$ atms/cm$^2$ (sample A) capable of securely causing the detachment phenomenon and $3 \times 10^{16}$ atms/cm$^2$ (sample B) being approximately the threshold value were respectively examined. As shown in FIG. 5, there is a difference in hydrogen concentration at the peak between samples A, B. Accordingly, it is confirmed that the detachment phenomenon occurs in the state where the hydrogen concentration at the peak exceeds $2 \times 10^{21}$ atms/cm$^2$–$3 \times 10^{21}$ atms/cm$^2$.

In this case, it is considered that the detachment phenomenon occurs at the depth corresponding to the peak of the hydrogen concentration, and the difference in the hydrogen concentration at the peak between sample A, B relates to the formation of the hydrogen gas microvoids. That is, it is considered that sample B hardly has microvoids in the defective part of the ion-implanted layer 13 and sample A has microvoids produced by extra hydrogen compared to that of sample B. In other words, hydrogen concentration nH that generates stress P expressed by equation (1) corresponds to the hydrogen concentration segregated in the microvoids, and hydrogen concentration nH exceeding $2 \times 10^{21}$ atms/cm$^2$–$3 \times 10^{21}$ atms/cm$^2$ causes the detachment phenomenon.

Stress P calculated based on the equation (1) is shown in FIG. 4. At that time, the ion implantation conditions are the acceleration voltage of 80 KeV and the dose of $5 \times 10^{16}$ atms/cm$^2$. The calculation result denotes that in the detaching step shown in FIG. 3H including the heat treatment of 400° C.–600° C., stress P becomes more than approximately 300 kgf/cm$^2$ to cause the detachment phenomenon. Incidentally, the hydrogen distributing state and the hydrogen concentration at the peak position change in accordance with the ion implantation conditions such as the acceleration rate and the dose. Therefore, hydrogen concentration nH, which corresponds to the extra hydrogen with respect to $2 \times 10^{21}$ atms/cm$^2$–$3 \times 10^{21}$ atms/cm$^2$ being the threshold voltage capable of causing the detachment phenomenon, changes in accordance with the ion implantation conditions, and stress P changes in accordance with the change in hydrogen concentration nH.

In this embodiment, to obtain the desired detachment in the detaching step, the bonding strength between the single crystal silicon substrate 11 and the base substrate 14 is set to be larger than stress P generated by the inside gas expanstion in the ion-implanted layer 13 during the heat treatment of the detaching step.

Specifically, for example, before the heat treatment in the separating step, a heat treatment is conducted to the integrally bonded substrates 11, 14 at a low temperature (for example, referring to FIG. 4, in a range of 300° C.–400° C., preferably in a range of 350° C.–400° C.) for approximately 1 hour not to cause the detachment phenomenon. Accordingly, the bonding strength between the substrates 11, 14 is increased. Then, the heat treatment at the high temperature in the range of 400° C.–600° C. is conducted in the detaching step to cause the detachment phenomenon. In the case that the heat treatment for increasing the bonding strength is conducted, concerning the bonding between the single crystal silicon substrate 11 and the base substrate 14 shown in FIG. 4, the bonding strength becomes larger than stress P generated by the inside gas expansion in the ion-implanted layer 13 at a temperature in a range of 400° C.–600° C. The heat treatment for increasing the bonding strength and the heat treatment in the detaching step can be successively performed in the same annealing apparatus. The heat treatment for increasioog the bonding strength can be performed in a manner such that a temperature is gradually raised to the target temperature lower than 400° C. at a temperature rising rate of for example 1° C./min.

Incidentally, there are some cases that the bonding strength between the single crystal silicon substrate 11 and generated by the inside gas expansion in the ion-implanted layer 13 due to the conditions of the bonding face and the like. In such cases, it is not always necessary to conduct the heat treatment for increasing the bonding strength before the detaching step.

On the other hand, after the single crystal silicon thin film 11 11b is detached from the single crystal silicon substrate 11 in the detaching step, although it is not shown specifically in the drawings, a heat treating step is further executed at a temperature (preferably approximately 1000° C. to 1200° C.) higher than the heat treatment temperature in the detaching step. Accordingly, the bonding strength at the bonding face between the insulating film 15 (buried oxide film) provided on the base substrate 14 and the single crystal silicon thin film 11b is further strengthened.

The heat treatments in the detaching step and the heat treating step may be carried out using an electric furnace annealing apparatus; however, in this embodiment an annealing apparatus having a high temperature rising rate such as a lamp annealing apparatus or a laser irradiation annealing apparatus is used so that the heat treatments are performed in a short duration of a few tens of seconds to a few minutes. This is possible because the detachment phenomenon at the defective part occurs instantaneously.

By the detachment at the defective part formed along with the ion implantation, the defective part remains on the detachment face of the single crystal silicon thin film 11b, and simultaneously minute steps of a few nm to several tens of nm in size also are formed on the detachment face. Therefore, in this embodiment, in a flattening step, the detachment face of the single crystal silicon thin film 11b is mechanically polished to remove the defective part and the minute steps therefrom. By executing the flattening step, finally, an SOI substrate (semiconductor substrate) 16 shown in FIG. 3I, in which the single crystal silicon thin film 11b for device formation is provided on the base substrate 14 via the insulating film 15, is completed. The flattening step need only be carried out as necessary.

Figure 3J:
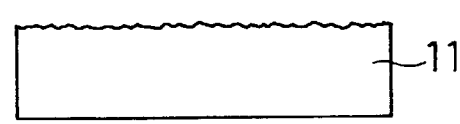
Figure 3K:

The single crystal silicon substrate 11 from which the single crystal silicon thin film 11b has been detached in the detaching step, on the other hand, is used again for the manufacture of another SOI substrate 16. Because of this, as shown in FIGS. 3J, 3K, the detachment face of the single crystal silicon substrate 11, which also has the defective part and minute steps thereon caused by the detachment, is mechanically polished by a flattening step for regeneration, to remove the defective part and the minute steps therefrom. The thus flattened single crystal silicon substrate 11 is then used again to carry out the steps from the above-mentioned protective film forming step (see FIG. 3A) onward.

According to this embodiment, before the bonding step of bonding together the single crystal silicon substrate 11 and the base substrate 14 is carried out, in the protective film removing step, the contamination protective film 12 on the single crystal silicon substrate 11 is removed. Therefore, even when flatness of the contamination protective film 12 is degraded during the ion implanting step or contaminants are segregated in the vicinity of the surface of the contamination protective film 12, the bonding state between the single crystal silicon substrate 11 and the base substrate 14 can be made to be uniform at the entire area of the bonding.

Figure 1A:
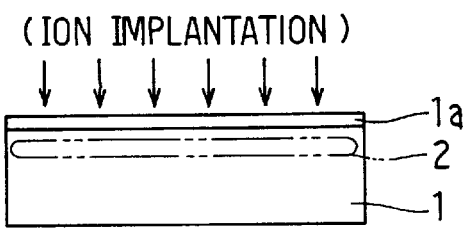
FIGS. 1A–1D are cross-sectional views schematically showing a manufacturing process of a semiconductor substrate in a stepwise manner in a prior art.
Figure 1B:
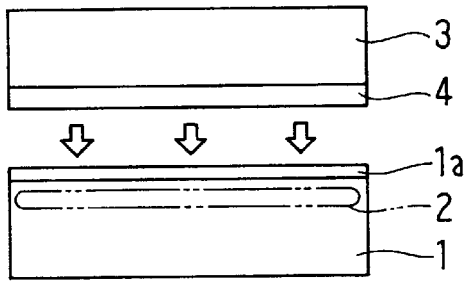
Figure 1C:
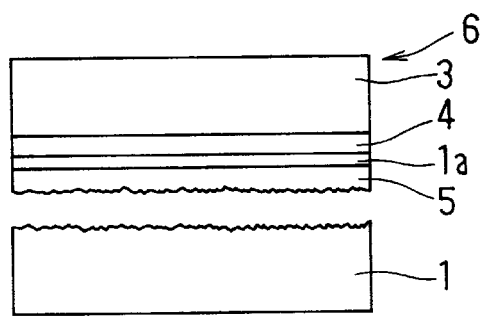
Figure 1D:
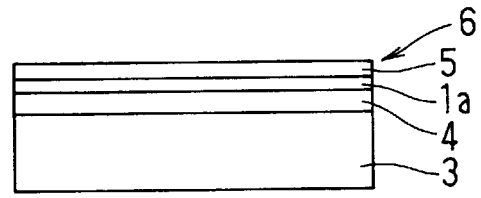
Figure 2:
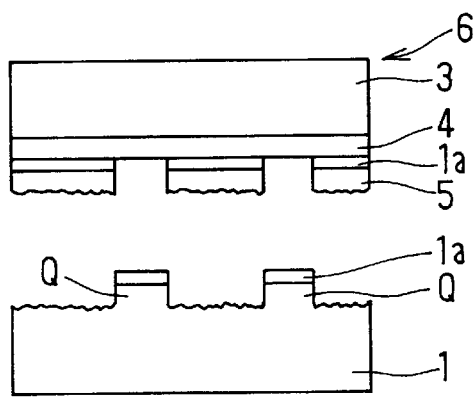
FIG. 2 is a schematic cross-sectional view for explaining a problem occurring in the manufacturing process of the prior art.

As a result, when the detaching step is executed, the phenomenon of the single crystal silicon thin film 11b being detached from the single crystal silicon substrate 11 proceeds uniformly in the entire defective part formed by the ion-implanted layer 13. Therefore, the surface portion of the single crystal silicon substrate 11 that is supposed to be the single crystal silicon thin film 11b is entirely detached from the single crystal silicon substrate 11 without partially remaining on the single crystal silicon substrate 11 as shown in FIG. 2. Consequently, the quality and the yield of the SOI substrate 16 is improved.

Also, in this embodiment, in the hydrophilizing step executed before the bonding step, the natural oxide films 11a, 14a are formed respectively on the ion implantation side surface of the single crystal silicon substrate 11 and the surface of the insulating film 15 on the base substrate 14. Because of this, in the SOI substrate 16 manufactured through the bonding step, the detaching step and the heat treating step, the single crystal silicon thin film 11b and the insulating film 15 are bonded together by way of the natural oxide films lha, 14a. Consequently, the bonding strength between the single crystal silicon thin film 11b and the insulating film 15 is increased, resulting in improvement in reliability of the SOI substrate 16.

Also, in this embodiment, because the bonding strength between the single crystal silicon substrate 11 and the base substrate 14 is controlled to be larger than the stress generated by the inside gas expansion in the ion-implanted layer 13, the single crystal silicon thin film 11b is desirably detached from the single crystal silicon substrate 11 in the detaching step.

Also, in this embodiment, after the detaching step is executed, the heat treating step is performed at a temperature (preferably approximately in a range of 1000° C. to 1200° C.) higher than the heat treatment temperature (in a range of 400° C. to 600° C.) of the detaching step. Therefore, the bonding strength between the single crystal silicon thin film 11b and the insulating film 15 in the SOI substrate 16 finally obtained is enhanced, resulting in further improvement in reliability of the SOI substrate 16.

Also, because the annealing apparatus having a high temperature rising rate such as a lamp annealing apparatus or a laser irradiation annealing apparatus is used for the heat treatments of the detaching step and the heat treating step, there is the merit that the throughput in these heat treatments can be increased.

In this embodiment, in manufacturing the SOI substrate 16, whereas a product wafer whose impurity concentration is controlled to a fixed value is preferably used for the single crystal silicon substrate 11 to ensure quality of the single crystal silicon thin film 11b, a dummy wafer whose impurity concentration is not particularly controlled can be used for the base substrate 14, since the base substrate 14 need only hold the single crystal silicon thin film 11b on the insulating film 15. A cheap substrate can therefore be used for the base substrate 14. In addition, the single crystal silicon substrate 11 from which the single crystal silicon thin film 11b is detached to form the SOI substrate 16 can be reused in the manufacture of another SOI substrate 16 by conducting the flattening step for regeneration. Efficient use of resources can thereby be achieved, and overall it is possible to achieve reductions in manufacturing cost.

Second Embodiment

Figure 6A:
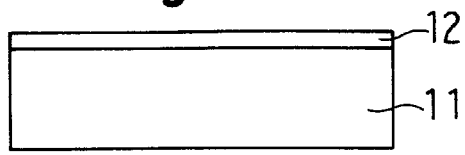
FIGS. 6A–6K are cross-sectional views schematically showing a manufacturing process for forming a semiconductor substrate in a stepwise manner in a second preferred embodiment.
Figure 6B:
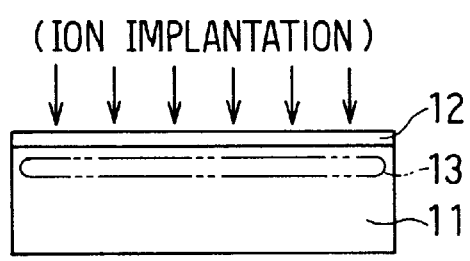

FIGS. 6A–6K show a second preferred embodiment of the invention, and points of the second embodiment differing from the first embodiment described above will now be described. Like FIGS. 3A–3K, FIGS. 6A–6K are schematic cross-sectional views illustrating steps for manufacturing an SOI substrate 16a. The same parts as those in the first embodiment are indicated with the same reference numerals. In the second embodiment, a protective film forming step shown in FIG. 6A and an ion implanting step shown in FIG. 6B are carried out substantially in the same way as in the first preferred embodiment shown in FIGS. 3A, 3B.

Figure 6C:
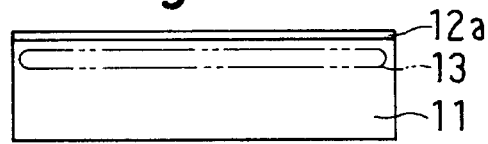

In a protective film removing step shown in FIG. 6C, only an upper part of the contamination protective film 12 on the single crystal silicon substrate 11 is removed. Accordingly, contaminants segregated in the surface vicinity of the contamination protective film 12 by the ion implanting step are removed while part of the contamination protective film 12 is left on the single crystal silicon substrate 11. The remaining contamination protective film 12 is herebelow referred to as a contamination protective film 12a. In this protective film removing step, chemical etching using aqueous hydrofluoric acid or the like is generally employed. However, in this embodiment, for example after the chemical etching treatment is performed using aqueous hydrofluoric acid ($HF:H_2O=1:50$) for 1 min., the etched face of the contamination protective film 12a is chemically and mechanically polished so that flatness thereof is improved, and specifically so that Ra (center line surface roughness) thereof becomes approximately 0.3 nm.

Figure 6D:
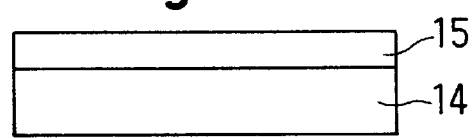
Figure 6E:
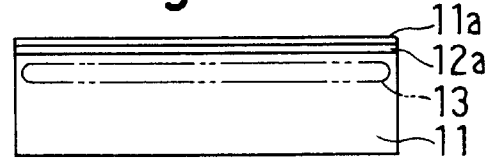
Figure 6F:
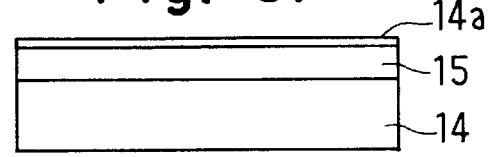

After that, an insulating film forming step shown in FIG. 6D is carried out in the same way as in the first embodiment (see FIG. 3D), and in a hydrophilizing step shown in FIGS. 6E, 6F, the same hydrophilizing treatment as in the first embodiment is carried out on the surface of the contamination protective film 12a remaining on the single crystal silicon substrate 11 and on the surface of the insulating film 15 to form the natural oxide films 11a, 14a.

Figure 6G:
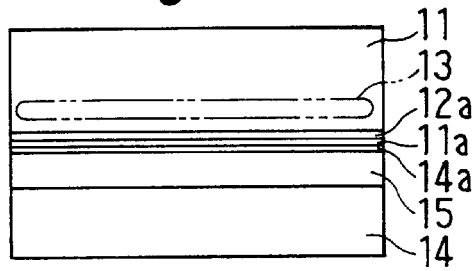
Figure 6H:
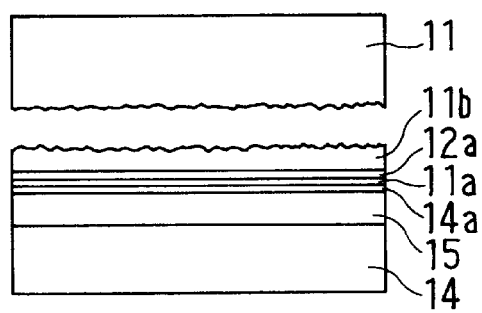
Figure 6I:
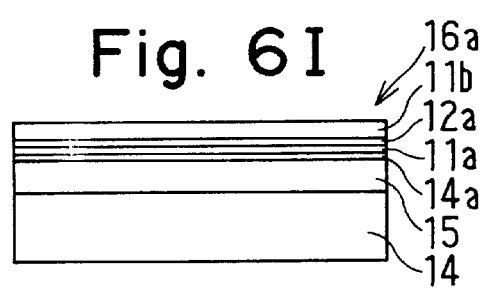
Figure 6J:
Figure 6K:

A bonding step shown in FIG. 6G, a detaching step shown in FIG. 6H, and a heat treating step are carried out in the same manner as in the first embodiment (see FIGS. 3g, 3H). Incidentally, it is also the same as in the first embodiment that the heat treatment for increasing the bonding strength between the single crystal silicon substrate 11 and the base substrate 14 is carried out before the detaching step. A flattening step shown in FIG. 6I are then carried out in the same way as in the first embodiment (see FIG. 3I). As a result, an SOI substrate (semiconductor substrate) 16a having the single crystal silicon thin film 11b for device formation disposed on the base substrate 14 via the insulating film 15 is completed. In this embodiment also, to enable the single crystal silicon substrate 11 to be reused, a flattening step of the kind illustrated in FIGS. 6J–6K is executed in the same way as in the first embodiment.

In this second embodiment, because before the bonding step is carried out, the upper part of the contamination protective film 12 on the single crystal silicon substrate 11 is removed in the protective film removing step and thereby flatness of the contamination protective film 12a remaining on the single crystal silicon substrate 11 is secured, while contaminants segregated in the surface region of the contamination protective film 12 are removed. Accordingly, the bonding state of the single crystal silicon substrate 11 and the base substrate 14 can be made uniform over the entire bonding area, so that the quality and yield of the SOI substrate 16a increase. Also, as in the first embodiment, the bonding strength between the single crystal silicon thin film 11b (in practice, the contamination protective film 12a) and the insulating film 15 can be increased by executing the heat treating step.

In the second embodiment, in the protective film removing step (see in FIG. 6C), after the etching using aqueous hydrofluoric acid is carried out, the etched surface of the contamination protective film 12a is chemically and mechanically polished to improve flatness thereof. The reasons that this flattening treatment is carried out is as follows.

Figure 7:
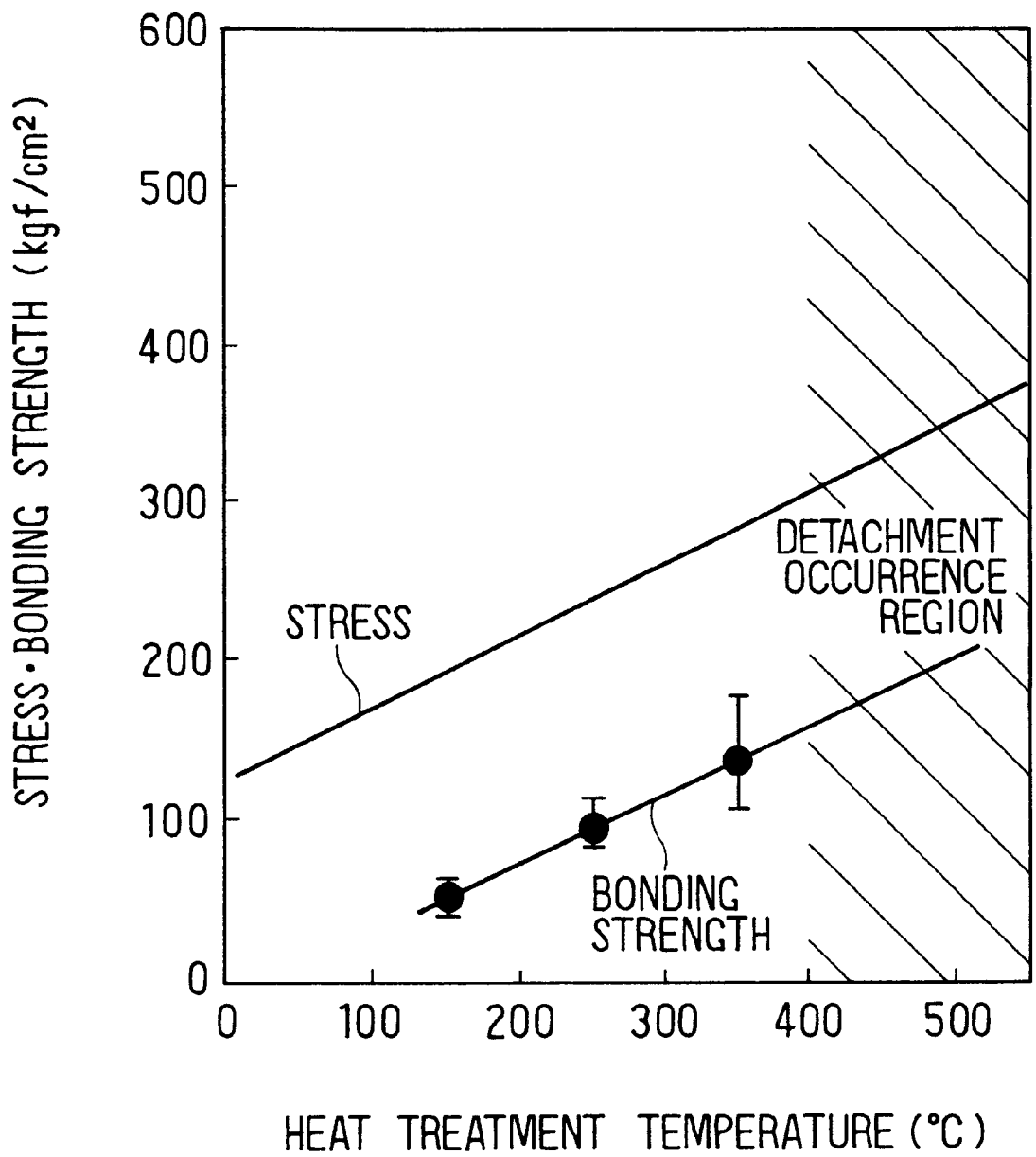
FIG. 7 is a characteristic chart showing relationships between a heat treatment temperature and a bonding strength in the semiconductor substrate and the heat treatment temperature and a stress generated by hydrogen gas expansion in the second embodiment.

That is, in the protective film removing step, after the contamination protective film 12 on the single crystal silicon substrate 11 is chemically etched using aqueous hydrofluoric acid (HF:$H_2O$=1:50) for 1 min. so that the contamination protective film 12a is left on the single crystal silicon substrate 11, and in the hydrophilizing treatment step, the natural oxide film 11a is formed on the contamination protective film 12a by washing for 20 min. with a mixture ($H_2SO_4$:$H_2O_2$=4:1) kept at 90° C. to 120° C., followed by rinsing with water for 20 min. The single crystal silicon substrate 11 is then bonded to the base substrate 14. In such a case, as shown in FIG. 7, in some cases, there arise a phenomenon that the bonding strength between the single crystal silicon substrate 11 and the base substrate 14 becomes small. Specifically, in the example shown in FIG. 7, the bonding strength is prominently smaller than the stress generated by the inside gas expansion caused by the heat treatment at a temperature in a rage of approximately 400° C. to 600° C. in the detaching step, i.e., smaller than the stress of more than 300 kgf/$cm^2$. This means that the bonding state is defective.

This phenomenon resulting in the defective bonding is considered to be caused by the insufficient flatness of the contamination protetive film 12 deteriorated by the chemical etching treatment. Specifically, Ra (center line surface flatness) was measured by an atomic force microscope (AMF) in a region of 500 nm×500 nm before and after the chemical etching treatment. As a result, it was confirmed that Ra was degraded from 0.3 nm to approximately 0.6 nm by the chemical etching treatment. Further, it was confirmed that the flatness was not degraded by the hydrophilizing treatment following the chemical etching treatment. Accordingly, it is considered that because the surface region of the contamination protective film 12 is damaged by the hydrogen ion implantation, the surface region is unevenly etched in the chemical etching treatment so that the flatness of the contamination protective film 12a consequently deteriorates. To overcome this, in this embodiment, after the chemical etching treatment is carried out, the chemical-mechanical polishing treatment is carried out on the etched surface of the contamination protective film 12a so that the flatness of Ra being approximately 0.3 nm is provided. As a result, the bonding strength between the single crystal silicon substrate 11 and the base substrate 14 bonded to each other in the subsequent bonding step increases, and thereby the detachment phenomenon can stably occur in the subsequent detaching step.

When contaminants including heavy metals are segregated in the outermost surface region with a shallow depth in the contamination protective film 12 by the ion implanting step, the contaminants can be removed only by the hydrophilizing treatment step ($H_2SO_4$:$H_2O_2$=4:1, 90° C.–120° C., 20 min., followed by rinsing with water, 20 min.). It is not necessary to conduct the protective film removing step. In addition, in this case, the flatness hardly deteriorates and keeps Ra of approximately 0.35 nm. When thus the sufficient flatness is obtained, the bonding strength is increased and the detachment phenomenon stably occurs in the detaching step. Accordingly, chemical etching operation of the hydrophilizing treatment step can served as the protective removing step in accordance with the surface state of the contamination protective film 12.

Third Embodiment

Figure 8A:
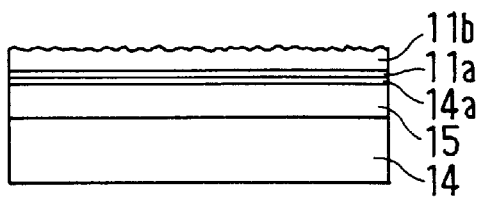
FIGS. 8A–8C are cross-sectional views schematically showing manufacturing steps for forming a semiconductor substrate in a third preferred embodiment.
Figure 8B:
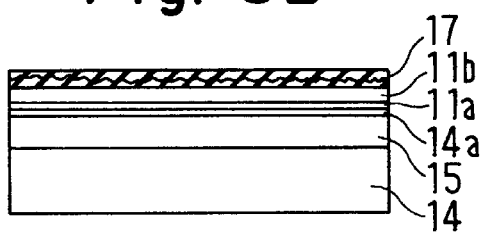
Figure 8C:
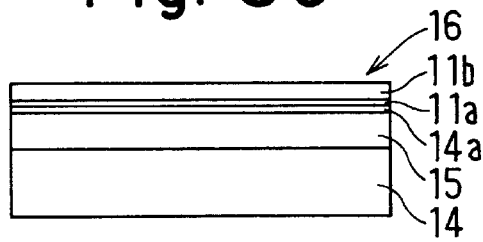

FIGS. 8A–8C show a third preferred embodiment of the invention, and points of the third embodiment differing from the first embodiment described above will now be described.

Whereas in the first embodiment, in the flattening step (see FIG. 3I) carried out after the execution of the detaching step and the heat treating step, the defective layer and the minute steps on the single crystal silicon thin film 11b are removed by mechanical polishing, in the third embodiment the defective layer and the minute steps on the single crystal silicon thin film 11b is removed by etching in a flattening step.

Specifically, in the third embodiment, first, by a heat treating step for increasing the bonding strength between the single crystal silicon thin film 11b and the insulating film 15 shown in FIG. 8A, a covering film 17 made of silicon oxide (semiconductor oxide) or silicon nitride (semiconductor nitride) is formed on the surface of the single crystal silicon thin film 11b by thermal oxidation or a nitridation process as shown in FIG. 8B. Accordingly, the defective layer and the minute steps existing on the surface (detachment face) of the single crystal silicon thin film 11b are taken in inside of the covering film 17.

After that, the flattening step of removing the covering film 17 by chemical etching or dry etching is carried out and thereby the defective layer and the surface steps on the surface of the single crystal silicon thin film 11b are removed. Consequently, the surface is flattened as shown in FIG. 8C. In addition, after that, if necessary, formation and etching of such a covering film 17 can be repeated one or more times, so that the flatness of the single crystal silicon thin film 11b is significantly improved. Also, after the etching treatment, chemical-mechanical polishing (CMP) treatment may be carried out on the single crystal silicon thin film 11b. In this case, the necessary polishing thickness can be reduced. This kind of flattening step can also be carried out in the second embodiment described above.

Fourth Embodiment

Figure 9A:
FIGS. 9A–9C are cross-sectional views schematically showing manufacturing steps for forming a semiconductor substrate in a fourth preferred embodiment.
Figure 9B:
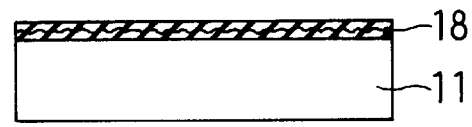
Figure 9C:
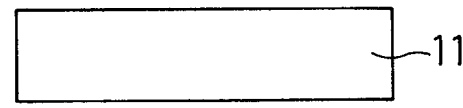

FIGS. 9A–9C show a fourth preferred embodiment of the invention, and points of the fourth embodiment differing from the first embodiment described above will now be described.

Whereas in the first embodiment, in the flattening step (see FIGS. 3J, 3K) for regenerating the single crystal silicon substrate 11, the defective layer and the minute steps on the single crystal silicon substrate 11 are removed by mechanical polishing, in this fourth embodiment the defective layer and the minute steps on the single crystal silicon substrate 11 are removed by etching in a flattening step.

Specifically, in the forth embodiment, first, on the single crystal silicon substrate 11 shown in FIG. 9A from which the single crystal silicon thin film is detached in the detaching step, a covering film 18 made of silicon oxide (semiconductor oxide) or silicon nitride (semiconductor nitride) is formed by thermal oxidation or nitridation as shown in FIG. 9B. Accordingly, the defective layer and the minute steps existing on the surface (detachment face) of the single crystal silicon substrate 11 are taken in inside of the covering film 18.

After that, the flattening step of removing the covering film 18 by chemical etching or dry etching is carried out and thereby the defective layer and the surface steps on the surface of the single crystal silicon substrate 11 are removed. Consequently, the surface of the single crystal silicon substrate 11 is flattened as shown in FIG. 9C. In addition, after that, if necessary formation and etching of such a covering film 18 can be repeated one or more times. The chemical-mechanical polishing (CMP) treatment may be carried out after the covering film 18 is etched. This kind of flattening step can also be carried out in the second and third embodiment described above.

The aspect of the present invention described in the first through fourth embodiments is not limited to these embodiments, and for example the following modifications and extensions are possible.

The semiconductor substrate material is not limited to single crystal silicon, and a substrate made of any semiconductor material based on a group four element, for example germanium (Ge), silicon carbide (SiC), silicon germanium (SiGe), or diamond can be used, or alternatively a polycrystalline silicon substrate, or an epitaxial silicon layer grown on a porous-silicon layer may be used.

The base substrate 14 does not have to be a single crystal silicon substrate, and another semiconductor substrate, an insulating ceramic substrate, a glass substrate or the like can also be used. In this case, if the base substrate itself is insulative, it is unnecessary to carry out a step of separately forming the insulating film 15 on the base substrate.

Although the natural oxide films are formed by successively carrying out washing with the mixture of sulfuric acid and hydrogen peroxide water and rinsing with pure water in the hydrophilizing step, for example a step of causing hydroxyl groups to directly bond to the surfaces being hydrophilized may be carried out by treating the surfaces with hydrofluoric acid and then rinsing them with pure water. In this case, the hydroxyl groups work to facilitate the bonding between the semiconductor substrate material and the base substrate, and accordingly, the base substrate is directly bonded to the semiconductor layer with a sufficient bonding strength. The surfaces being hydrophilized are in the first preferred embodiment the ion implantation side surface of the single crystal silicon substrate 11 and the surface of the insulating film 15 on the base substrate 14, and are in the second preferred embodiment the surface of the contamination protective film 12a and the surface of the insulating film 15 on the base substrate 14. Further, the heat treatments of the detaching step and the heat treating step may be executed as one continuous annealing treatment.

Fifth Embodiment

A fifth preferred embodiment of the present invention will now be described with reference to FIGS. 10A–10F and FIG. 11.

Figure 10A:
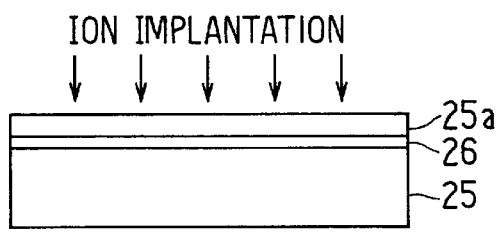
FIGS. 10A–10F are cross-sectional views schematically showing manufacturing steps for forming a semiconductor substrate in a fifth preferred embodiment.
Figure 10D:
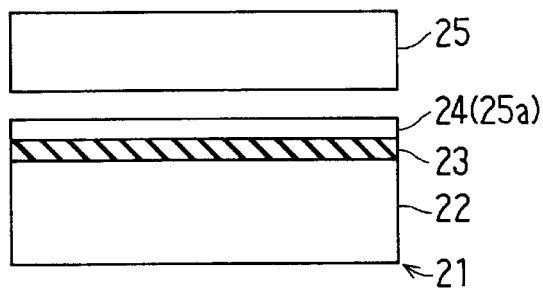

A semiconductor substrate (SOI substrate) 21 of this embodiment, as shown in for example FIG. 10D, has a single crystal semiconductor layer 24 for device formation formed on a base substrate 22 consisting of for example a single crystal silicon substrate (silicon wafer) via a silicon oxide insulating film 23.

Here, the single crystal semiconductor layer 24 is made of high-quality single crystal silicon, while the base substrate 22 is made of a material with a quality inferior to that of the single crystal semiconductor layer 24. Specifically, what is called a dummy grade wafer, whose resistance value has fallen outside product specifications in a silicon wafer manufacturing process, is used for the base substrate 22. The dummy grade silicon wafer is commercially available for approximately half of the price of the regular product. The thickness of the single crystal semiconductor layer 24 is for example 1 $\mu$m.

A method for manufacturing the semiconductor substrate 21 will now be described. First, in step P1, a defective layer (ion-implanted layer) 26 is formed in a bonding substrate (semiconductor substrate material) 25. Specifically, the bonding substrate 25 consists of a regular high-quality single crystal silicon substrate (silicon wafer), and in an initial state its thickness is for example approximately 600 $\mu$m. In step P1, as shown in FIG. 10A, ions obtained by ionizing for example hydrogen gas are accelerated with a predetermined implantation energy and are implanted into the surface region of the bonding substrate 25.

In this way, the defective layer 26 for detachment is formed at a predetermined depth position (for example at a depth position of 1 $\mu$m from the surface) in the bonding substrate 25 by ion implantation. Also, a single crystal thin film 25a (later to be a single crystal semiconductor layer 24) consisting of single crystal silicon is formed in the surface region of the bonding substrate 25, partitioned from the bulk of the bonding substrate 25 by the defective layer 26. As the material used for the ion implantation, besides hydrogen gas, noble gas such as helium, neon, or the like can alternatively be used.

At this time, although it is not illustrated in the drawings, an oxide film for as far as possible preventing contamination during the ion implantation is formed on the surface of the bonding substrate 25, and the ions are implanted into the bonding substrate 25 through the oxide film. After the defective layer 26 is formed by the ion implantation, the oxide film is removed by for example chemical etching with aqueous hydrofluoric acid (HF).

Figure 10B:
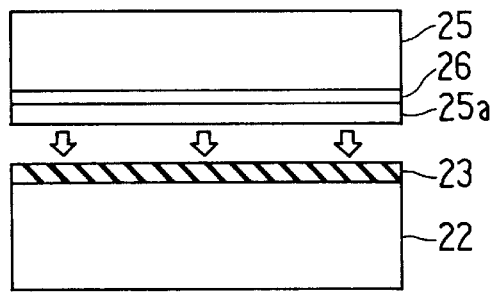

In step P2, the bonding substrate 25 is bonded to the above-mentioned base substrate (silicon substrate) 22. Specifically, as shown in FIG. 10B, an insulating film (oxide film) 23 is formed on the base substrate 22 by thermal oxidation or a deposition method such as a CVD method or a PVD method and polished to a mirror finish before the bonding. The single crystal thin film 25a of the bonding substrate 25 is bonded to the base substrate 22 through the insulating film 23.

As mentioned in the above embodiments, before performing the bonding, washing with for example a mixture of sulfuric acid ($H_2SO_4$) and hydrogen peroxide water ($H_2O_2$) with 4:1 ratio and rinsing with pure water are successively carried out on the surfaces of the base substrate 22 and the bonding substrate 25 and then the amounts of water adsorbed thereto are controlled by spin drying. By this means, the base substrate 22 and the bonding substrate 25 are intimately bonded to each other by hydrogen bonding of silanol radicals formed on the bonding faces thereof and water molecules adsorbed onto the bonding faces. In this way, although it is not illustrated in the drawings, the bonding substrate 25 is integrated to the base substrate 22 through the insulating film 23 with the single crystal thin film 25a, the defective layer 26 and the bulk part of the bonding substrate 25 in a stack.

Figure 10E:
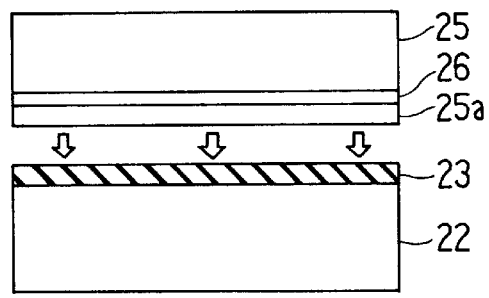
Figure 10C:
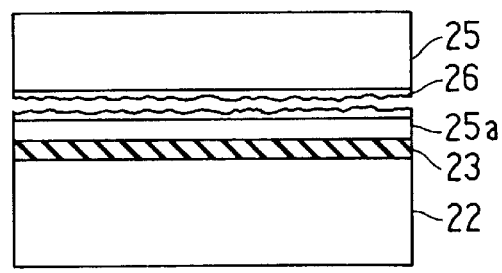

Next, in step P3, i.e., in a detaching step, the bonding substrate 25 is detached from the base substrate 22 at the defective layer 26. As shown in FIG. 10C, the detachment is based on an effect of cracking occurring at the defective layer 26 inside the bonding substrate 25 when a high-temperature heat treatment at for example 500° C. is carried out. By this means, the single crystal thin film 25a which is formed above the defective layer 26 of the bonding substrate 25 is detached from the bulk of the bonding substrate 25 and is as it were transferred to the base substrate 22. Accordingly, the semiconductor substrate 21 having the base substrate 22, the insulating film 23, and the single crystal semiconductor layer 24 (the single crystal thin film 25a) stacked in this order is provided.

Then, in step P4, high-temperature annealing is carried out at a temperature of for example 1000° C. to 1200° C. on the semiconductor substrate 21. As a result, the bonding at in the semiconductor substrate 21 is strengthened. At the same time, recovery of defects, removal of surface oxides, and partial flattening accompanying silicon flow are achieved on the detachment face. Also, in step P5, as shown in FIG. 10D, the surfaces (detachment faces) of the semiconductor substrate 21 and the bonding substrate 25 from which the single crystal thin film 25a is detached are polished. As a result, minute irregularities on the detachment faces are removed.

In the semiconductor substrate 21 manufactured in this way, even if the base substrate 22 is a substrate with a quality inferior to the single crystal semiconductor layer 24, it can amply fulfil the role of supporting the single crystal semiconductor layer 24. Also, because the semiconductor substrate 21 is made by bonding so that the insulating film 23 is interposed between the base substrate 22 and the single crystal semiconductor layer 24, impurities included in the base substrate 22 do not adversely affect the single crystal semiconductor layer 24. In particular in this embodiment, because the base substrate 22 and the single crystal semiconductor layer 24 (the bonding substrate 25) are made of materials (single crystal silicon) having the same thermal expansion coefficient, warps are prevented from occurring to the semiconductor substrate 21 by the heat treatment.

Figure 10F:
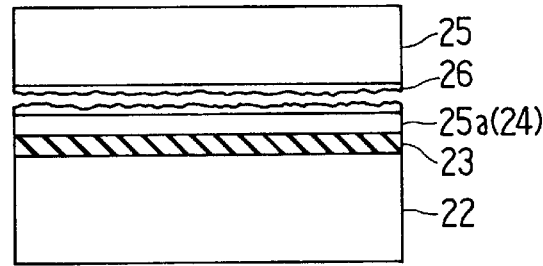

Here, when the above-mentioned semiconductor substrate 21 is mass-produced, steps P1–P5 are repeated. At this time the bonding substrate 25 detached from the semiconductor substrate 21 is reused in the manufacture of other semiconductor substrates 21. That is, as shown in FIG. 10E, the defective layer 26 and the single crystal thin film 25a are formed in the bonding substrate 25 by the ion implantation in the same way as mentioned above and the bonding 40o substrate 25 is bonded to a new base substrate 22 having the insulating film 23. After that, as shown in FIG. 10F, the detaching step is carried out again, so that another semiconductor substrate 21 is obtained. The bonding substrate 25 detached from the semiconductor substrate 21 is further used in the manufacture of the next semiconductor substrate 21 after the surface thereof is flattened.

Figure 11:
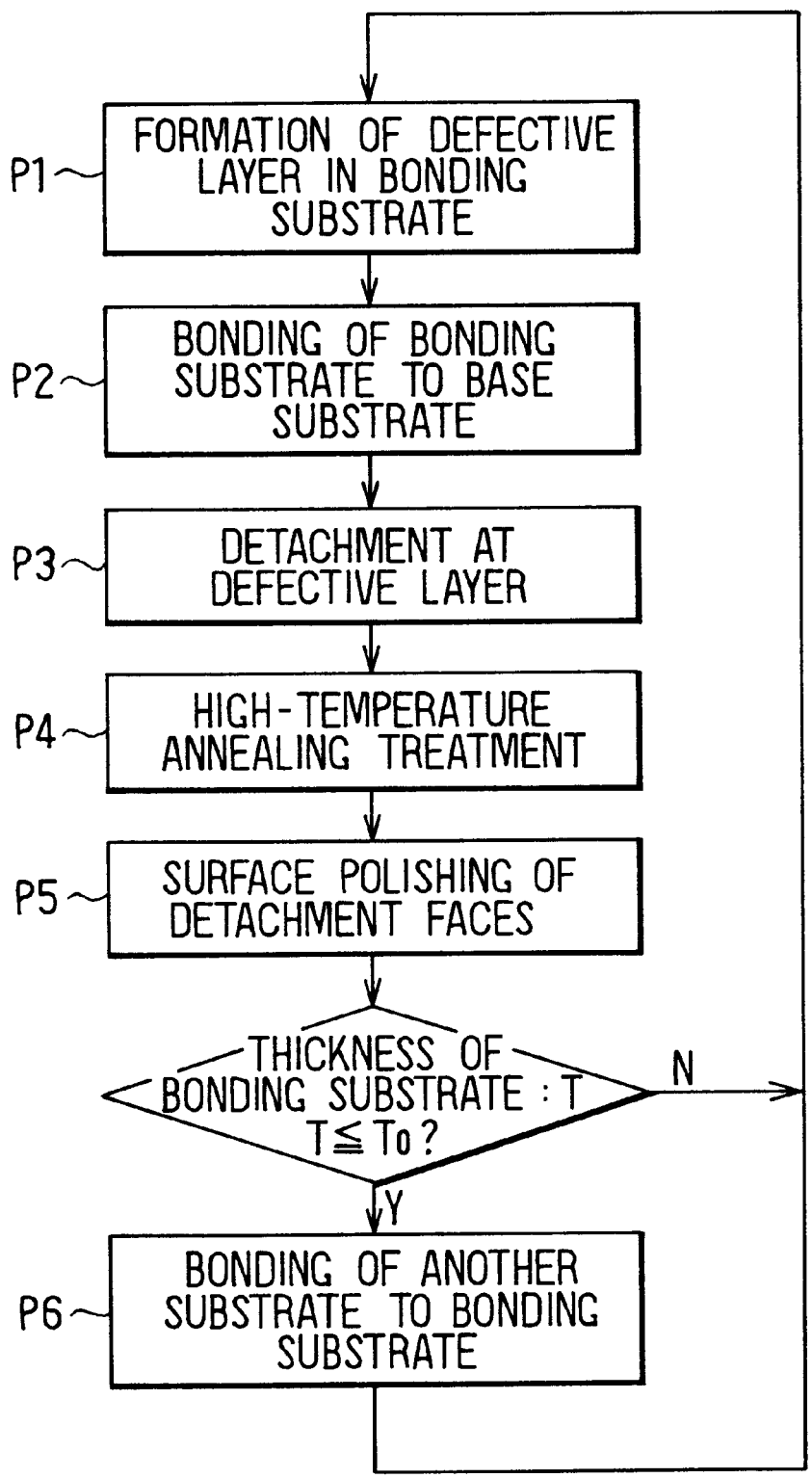
FIG. 11 is a flow chart for explaining the manufacturing steps of the semiconductor substrate in the fifth embodiment.

In this method, because with each use the thickness of this bonding substrate 25 decreases by at least a thickness (for example 2 $\mu$m) corresponding to the single crystal thin film 25a (the single crystal semiconductor layer 24) and the defective layer 26, with repeated use it gradually becomes thin and its strength decreases. Eventually it becomes too thin to be used. In this connection, in this embodiment, as shown in FIG. 11, it is determined whether or not thickness T of the bonding substrate 25 is equal to or smaller than predetermined thickness To (for example 500 $\mu$m). When thickness T is larger than predetermined thickness $T_0$, the bonding substrate 25 is used again. When thickness T is equal to or smaller than predetermined thickness $T_0$ (in other words, when the bonding substrate 25 has been reused a predetermined number of times), in step P6, a new single crystal silicon substrate of the same (high-quality) material as that of the bonding substrate 25 is integrally bonded to the thinned bonding substrate 25 on an opposite side of the detachment face to form a new bonding substrate 25.

Step P6 for bonding the two bonding substrates 25 is carried out in substantially the same way as the above-mentioned step P2 and therefore will not be described in detail here. By conducting step P6, the thinned bonding substrate 25 and the new bonding substrate 25 can be as it were spliced and used as a thick (thicker than 600 $\mu$m) new laminating substrate 25. In this way, the laminating substrate 25 consisting of a high-quality single crystal silicon substrate can be used with almost no waste.

Thus in this embodiment, the semiconductor substrate 21 has the single crystal semiconductor layer 24 disposed on the base substrate 22 via the insulating film 23, and the base substrate 22 is made from a material of a quality inferior to, or in other words cheaper than, the single crystal semiconductor layer 24. As a result, the semiconductor substrate 21 in this embodiment can be manufactured at significantly low cost compared to a semiconductor substrate of the related art wherein both a base substrate and a single crystal silicon thin film are made from high-quality materials.

Also, in this embodiment, because the base substrate 22 is made from a so-called dummy grade silicon wafer, its thermal expansion coefficient is the same as that of the bonding substrate 25 so that no warp occurs to the semiconductor substrate 21 during the heat treatment. In addition, because the dummy grade single crystal silicon wafer which is outside product specifications can be used for a part of the product, effective use of resources can be achieved.

Further, because the high-quality bonding substrate 25 for forming the single crystal semiconductor layer 24 can be used repeatedly with its thickness decreasing slightly each time, the relatively expensive bonding substrate 25 can be used efficiently, resulting in good performance of mass production. In particular in this embodiment, when the thickness of the bonding substrate 25 becomes thinner than predetermined thickness $T_0$, a single crystal silicon substrate made of the same material is integrally bonded to the bonding substrate 25 on an opposite side of the detachment face so that it is then used as a new bonding substrate 25. Accordingly, the expensive bonding substrate 25 can be used with almost no waste and thus further reductions in cost can be achieved.

As the bonding substrate 25 for forming the single crystal semiconductor layer 24, for example a silicon ingot (a cylinder of silicon to be sliced into wafers) or a thick single crystal silicon plate of several mm or several cm in thickness may be used. In this case, because the frequency of bonding (splicing) a new bonding substrate when the bonding substrate 25 falls below predetermined thickness $T_o$ is reduced, the cost-reduction effect is increased.

Figure 12A:
FIGS. 12A–12C are cross-sectional views schematically showing steps of a surface treatment carried on a bonding substrate detached from the semiconductor substrate in a modified embodiment of the fifth embodiment.

Here, the bonding substrate 25 detached from the semiconductor substrate 21 at the defective layer 26 in step P3, as shown in FIG. 12A, has minute irregularities (defects) on its surface, which are schematically shown in the drawing in an exaggerated state. Also, the surface of the bonding substrate 25 has some contaminants such as heavy metals produced during the ion implantation.

Figure 12B:
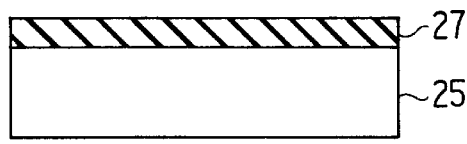
Figure 12C:
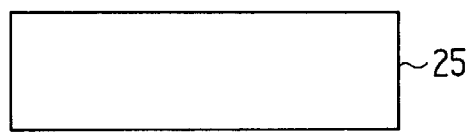

For this reason, in this embodiment, surface polishing is carried out to remove the above-mentioned defects and contaminants. However, as in the fourth embodiment described above, it is also possible to first form a silicon oxide film 27 (or a silicon nitride film) by thermal oxidation (or nitridation) as shown in FIG. 12B to take the defects and contaminants inside of the silicon oxide film 27 by gettering. After that, the silicon oxide film 27 (or silicon nitride film) is removed by chemical etching or dry etching. Accordingly, the defectives and the contaminants are removed from the bonding substrate 25, and at the same time the surface of the bonding substrate 25 is flattened as shown in FIG. 12C.

The bonding substrate 25 on which the steps described above are carried out has extremely little contaminants and few defectives and is returned to a high-quality state, so that the bonding substrate 25 can be reused in the manufacture of another semiconductor substrate 21. Consequently, the bonding substrate 25 is possible to always form a high-quality single crystal semiconductor layer 24.

Sixth Embodiment

FIGS. 13A–13D show a sixth preferred embodiment of the present invention. In this embodiment, first, trenches 28 are formed in the bonding substrate 25 by trench working such as etching or the like. In this case, the trenches 28 are formed in such positions that they divide the single crystal semiconductor layer 24 into small regions of predetermined areas for device formation. The trenches 28 have a depth of for example 10 $\mu$m which is deeper than the ion implantation depth. The insides of the trenches 28 are filled in with a polycrystalline silicon film 30 via an insulating film 29 to realize uniformity of the ion implantation depth and the like.

Figure 13A:
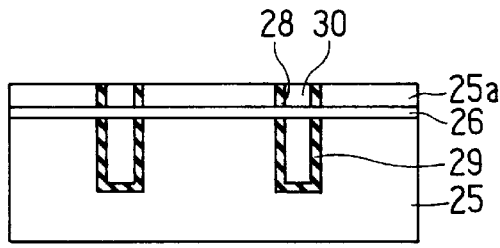
FIGS. 13A–13D are cross-sectional views mainly showing steps of a treatment carried on a bonding substrate in a sixth preferred embodiment.
Figure 13B:
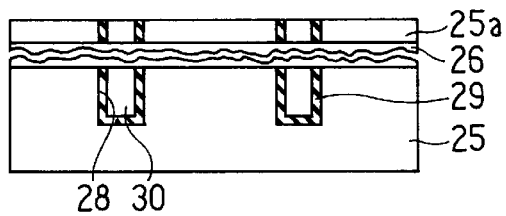
Figure 13C:
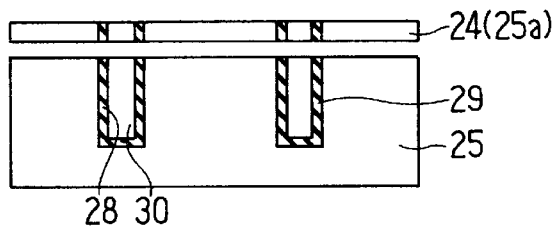

From this state, ions are implanted into the surface of the bonding substrate 25 to form the defective layer 26 at a depth position of for example 0.5 $\mu$m as shown in FIG. 13A. Then a step of bonding the bonding substrate 25 to a base substrate (not shown) and a detaching step and so on are executed as shown in FIG. 13B, and a surface polishing step is carried out as shown in FIG. 13C. Accordingly, a semiconductor substrate (not shown) having the single crystal semiconductor layer 24 divided into device formation regions is provided.

Figure 13D:
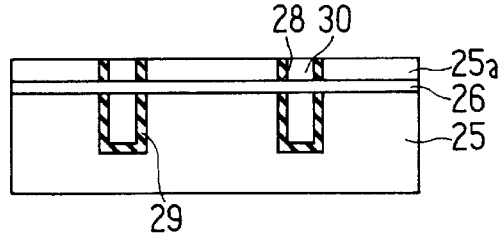

By detaching the single crystal semiconductor layer 24 from the base substrate 25 and polishing the detachment face of the bonding substrate 25, the thickness of the bonding substrate 25 become thinner than its initial thickness by approximately 1 $\mu$m. That is, the depth of the trenches 28 is decreased to 9 $\mu$m. After that, in the same way, the above-mentioned steps from the formation of the defective layer 26 by ion implantation onward are repeated on the bonding substrate 25 as shown in FIG. 13D. In this second time also, a semiconductor substrate having a single crystal semiconductor layer 24 divided into device formation regions is again obtained.

In this way, for one process of forming the trenches 28 in the bonding substrate 25, ten semiconductor substrates each having a single crystal silicon semiconductor layer 24 divided into device formation regions can be obtained. Therefore, according to the sixth embodiment, compared to the case that etching is carried out on each single crystal silicon semiconductor layer to divide it into the device formation regions after the single crystal silicon semiconductor layer is detached from the bonding substrate, the manufacturing process can be simplified.

In the fifth and sixth embodiments, as the base substrate 22, a so-called dummy grade silicon wafer whose resistance value is off-specification is employed; however, besides this it is also possible to use wafers discarded after being used in an LSI manufacturing plant, a research laboratory or the like for purposes such as adjustment or testing or the like of manufacturing apparatuses or test apparatuses, or wafers having failed pre-shipping tests or in batches discarded for some reason part-way through a process. These wafers can be used after going through steps such as washing, etching and surface polishing to clean their surfaces. Additionally, technology for removing surface regions using hydrogen ion implantation may be used for the cleaning of the wafers.

The aspect of the invention illustrated by the fifth and sixth preferred embodiments described above is not limited to these embodiments, and for example the base substrate may alternatively be a ceramic substrate or a quartz substrate. Various gases can be employed for the ion implantation, and in this case the optimum detachment temperature and so on differ according to the ions being used. Also, it is apparent that the optimum treatment temperatures in the respective steps vary depending on the materials of the base substrate and the bonding substrate. The thicknesses of the respective parts given in the preferred embodiments also are preferable examples, and thus various suitable changes can be made within the scope of the invention. It will further be understood that these fifth and sixth preferred embodiments can be suitably combined with the first through fourth preferred embodiments described hereinbefore.

Seventh Embodiment

A seventh preferred embodiment of the present invention will now be described with reference to FIGS. 14A–14L. In the seventh embodiment, two SOI substrates are simultaneously manufactured by one process. Specifically, first, in a preparing step shown in FIG. 14A, both faces of a for example single crystal silicon wafer 111 (semiconductor substrate material) are flattened (mirrorized) by chemical-mechanical polishing (CMP). In this case, when a commercially available one-face-polished type substrate is used as the single crystal silicon wafer 111, chemical-mechanical polishing is carried out on the unpolished face (the rear face) only.

Figure 14A:
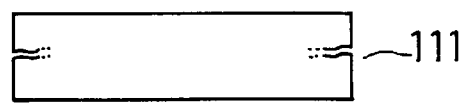
FIGS. 14A–14L are cross-sectional views schematically showing a manufacturing process for forming semiconductor substrates in a stepwise manner in a seventh preferred embodiment.
Figure 14B:

In a protective film forming step, as shown in FIG. 14B, a contamination protective film 121 made of silicon oxide film with a uniform thickness is formed over the entire surface of the single crystal silicon wafer 111 by thermally oxidizing the single crystal silicon wafer 111. The contamination protective film 121 is for preventing the single crystal silicon wafer 111 from being contaminated by heavy metals and the like in an ion implanting step which will be discussed later. The thickness of the contamination protective film 121 is preferably set to approximately 50 nm to 100 nm. Instead of the thermal oxidation, contamination protective films made of silicon oxide can be formed on the front and rear faces of the single crystal silicon wafer 111 by a deposition method such as a CVD method or a PVD method.

Figure 14C:
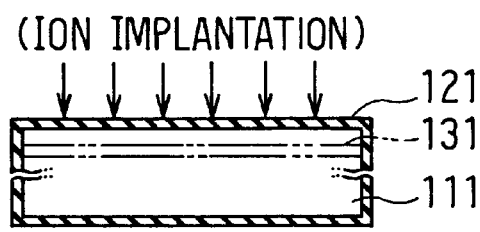
Figure 14D:
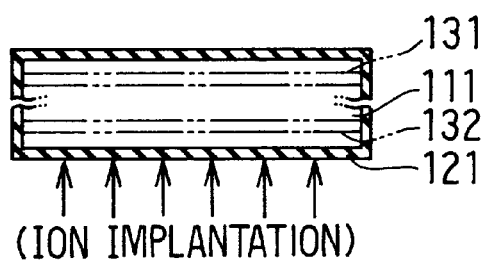

After that, in a first ion implanting step shown in FIG. 14C, hydrogen ions or noble gas ions are implanted into the single crystal silicon wafer 111 from one face as shown with arrows in the drawing so that a first ion-implanted layer 131 parallel with the face of the single crystal silicon wafer 111 is formed. Then, in a second ion implanting step shown in FIG. 14D, hydrogen ions or noble gas ions are implanted into the single crystal silicon wafer 111 from the other face as shown with arrows in the drawing so that a second ion-implanted layer 132 parallel with the face of the single crystal silicon wafer 111 is formed.

The dose in these first and second ion implanting steps, in the case of hydrogen ions, is set to more than $1 \times 10^{16}$ atoms/cm$^2$ and preferably more than 5×10$^{16}$ atoms/cm$^2$. The ion implantation energy is set in accordance with the depths at which the first ion-implanted layer 131 and the second ion-implanted layer 132 are to be formed. In this embodiment, the ion implantation conditions in the first and second ion implanting steps are set to be the same. For the implanted ions, besides the above-mentioned hydrogen and noble gases, various other gases such as oxygen, chlorine and fluorine can be used.

Figure 14E:
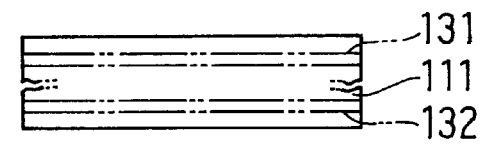

In a protective film removing step shown in FIG. 14E, the contamination protective film 121 on the single crystal silicon wafer 111 is completely or partially removed by chemical etching using for example aqueous hydrofluoric acid. The state after the contamination protective film 121 is completely removed is shown in FIG. 14E. The removal of the contamination protective film 121 from the front and rear faces of the single crystal silicon wafer 111 can also be carried out by chemical mechanical polishing, dry or wet etching.

Figure 14F:
Figure 14G:

Meanwhile, in an insulating film forming step shown in FIGS. 14F, 14G, two base substrates 141, 142 consisting of single crystal silicon wafers are prepared. Then, insulating films 151, 152 made of silicon oxide with a uniform thickness are formed over the entire surfaces of the base substrates 141, 142 by thermally oxidizing the base substrates 141, 142. When the SOI substrates are finally formed, these insulating films 151, 152 become buried oxide films, and their thicknesses are set to a value (for example 100 nm to 1000 nm) according to the design shape of the SOI substrates. Instead of the above-mentioned thermal oxidation, a silicon oxide insulating film can be formed on one face (for serving as a bonding face described later) of each of the base substrates 141, 142 by a deposition method such as CVD or PVD.

Figure 14H:
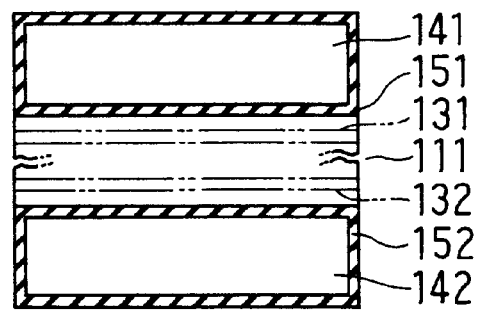

After that, a bonding step shown in FIG. 14H is carried out. In the bonding step, first, a hydrophilizing treatment is carried out on the both faces of the single crystal silicon wafer 111 and one face (the bonding face) of each of the base substrates 141, 142 to make them hydrophilic. Specifically, in the hydrophilizing treatment, the single crystal silicon wafer 111 and the base substrates 141, 142 are immersed in an acidic solution such as a mixture of sulfuric acid and hydrogen peroxide water (H$_2$SO$_4$:H$_2$O$_2$=4:1) held at a predetermined temperature (for example 900° C. to 120° C.) to provide them with hydrophilicity by forming an extremely thin natural oxide films (not shown) over the entire surfaces of the single crystal silicon wafer 111 and of the base substrates 141, 142 (the surfaces of the insulating films 151, 152). The thicknesses of the natural oxide films are for example molecular film level. Then, rinsing with ultrapure water is carried out and drying with a spin drier is carried out to control amounts of water adsorbed onto the surfaces of the single crystal silicon wafer 111 and the base substrates 141, 142.

Next, the surfaces of the base substrates 141, 142 are brought into intimate contact with the front and rear surfaces of the single crystal silicon wafer 111. As a result, the single crystal silicon wafer 111 and the base substrates 141, 142 are bonded to one another by hydrogen bonding of silanol radicals and water molecules disposed on the hydrophilized surfaces.

Figure 14I:
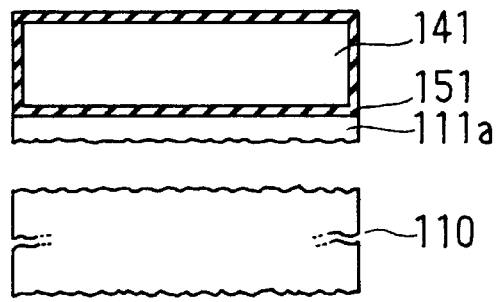

After that, in a detaching step, a heat treatment is carried out on the single crystal silicon wafer 111 and the base substrates 141, 142 thus bonded together in an inert gas atmosphere of for example nitrogen. Accordingly, as shown in FIG. 14I, the base substrates 141, 142 are detached from the single crystal silicon wafer 111 at defective layers formed in the first ion-implanted layer 131 and in the second ion-implanted layer 132. As a result, an SOI structure having a single crystal silicon thin film (semiconductor layer) 111a disposed on the base substrate 141 via the insulating film 151 and an SOI structure having a single crystal silicon thin film (semiconductor layer) 111b provided on the base substrate 142 via the insulating film 152 are formed. Incidentally, a single crystal silicon wafer 110 from which the single crystal silicon thin films 111a, 111b are removed remains. The above-mentioned defective layers are formed at the maximum diffusion depth of the implanted ions.

In this case, specifically, when the first ion-implanted layer 131 and the second ion-implanted layer 132 are formed using hydrogen ions, the heat treatment is preferably carried out at a temperature in a range of approximately 400° C. to 600° C. As mentioned in the above embodiments, in response to the heat treatment, minute bubbles agglomerate to form microvoids at the defective layers formed in the first ion-implanted layers 131, 132, and this causes detachment at the defective layers.

After the single crystal silicon thin films 111a, 111b are detached from the single crystal silicon wafer 111 by the detaching step, although it is not specifically illustrated in the drawings, a further heat treating step is executed to the SOI structures in an inert gas atmosphere of for example nitrogen for a predetermined time (for example over one hour) at a temperature (more than 1000° C., and preferably in a range of 1100° C. to 1200° C.) higher than the heat treatment in the detaching step. Accordingly, the bonding strengths between the insulating film 151 (buried oxide film) on the base substrate 141 and the single crystal silicon thin film 111a and between the insulating film 152 (buried oxide film) on the base substrate 142 and the single crystal silicon thin film 111b increase.

Figure 14J:
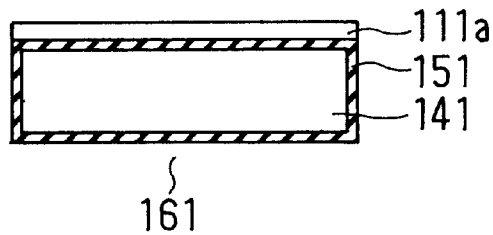
Figure 14K:
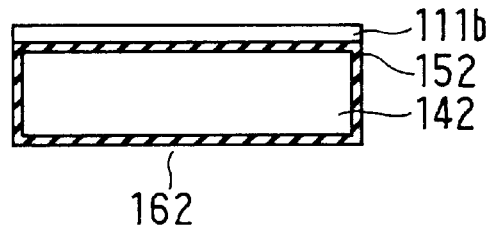

On the detachment faces of the single crystal silicon thin films 111a, 111b, part of the defective layer formed during the ion implantation remains with minute steps of a few nm to several tens of nm in size. For this reason, in this embodiment, the detachment faces of the single crystal silicon thin films 111a, 111b are flattened by chemical-mechanically polishing in a flattening step to remove the defective layer and the minute steps therefrom. As a result of the flattening step, finally, two SOI substrates (semiconductor substrates) 161, 162 shown in FIG. 14J, 14K are completed. The above-mentioned flattening step need only be carried out when necessary.

Figure 14L:
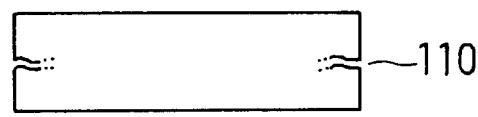

The single crystal silicon wafer 110 from which the single crystal silicon thin films 111a, 111b are removed in the detaching step is used in the manufacture of other SOI substrates 161, 162. To this end, the detachment faces (the front and rear faces) of the single crystal silicon wafer 110 are flattened (mirrorized) by a regenerating step of chemical-mechanical polishing as shown in FIG. 14L. As a result, defective layers and minute steps remaining on the detachment faces are removed. The single crystal silicon wafer 110 is then used again to carry out the steps described above from the protective film forming step (see FIG. 14B) onward.

According to this embodiment, it is possible to manufacture the two SOI substrates 161, 162 only by performing one heat treatment in the detaching step and one heat treating step immediately after the detaching step. As a result, the manufacturing efficiency of the SOI substrates 161, 162 increases, and accordingly the time required for the manufacture decreases and throughput is improved, thereby realizing reduction in overall manufacturing cost.

Further, as described above, after the detaching step, the heat treating step is carried out at a higher temperature than the heat treatment temperature in the detaching step. Accordingly, the bonding strengths between the single crystal silicon thin film 111a and the insulating film 151 and between the single crystal silicon thin film 111b and the insulating film 152 are increased, so that the reliability of the finally provided SOI substrates 161, 162 increases.

Because the first ion implanting step for forming the first ion-implanted layer 131 is carried out from one side of the single crystal silicon wafer 11 and the second ion implanting step for forming the second ion-implanted layer 132 is carried out from the other side of the single crystal silicon wafer 11, the depth positions at which the first and second ion-implanted layers 131, 132 are formed can be set accurately. Accordingly, it becomes easy to control the thicknesses of the single crystal silicon thin films 111a, 111b of the SOI substrates 161, 162.

Also, in this embodiment, because the ion implantation conditions in the first and second ion implanting steps are made the same, the characteristics of the two SOI substrates 161, 162 can be made the same. That is, it is possible to manufacture two SOI substrates having the same specifications easily. However, the ion implantation conditions in the first and second ion implanting steps may be set to be different from one another if necessary. In this case, it is possible to simultaneously obtain two SOI substrates having different characteristics such as thicknesses of single crystal silicon thin films.

In this embodiment, in the hydrophilizing treatment executed before the bonding step, the natural oxide films (not shown) are formed on the surfaces of the single crystal silicon wafer 11 and the surfaces of the base substrates 141, 142 (that is, the surfaces of the insulating films 151, 152). Consequently, in the SOI substrates 161, 162 manufactured through the bonding step, the detaching step and the heat treating step which follow, the natural oxide films with an extremely thin thickness (for example of a molecular film level) are interposed respectively between the single crystal silicon thin film 111a and the insulating film 151 and between the single crystal silicon thin film 111b and the insulating film 152. As a result, the bonding strengths between the single crystal silicon thin film 111a and the insulating film 151 and between the single crystal silicon thin film 111b and the insulating film 152 are increased, resulting in improvement of the reliability of the SOI substrates 161, 162.

Also, in this embodiment, in the manufacture of the SOI substrates 161, 162, a product wafer, that is, a wafer whose impurity concentration is controlled to a fixed value, is preferably used for the single crystal silicon substrate 111 to ensure quality of the single crystal silicon thin films 111a, 111b. On the other hand, dummy wafers whose impurity concentration is not particularly controlled can be used for the base substrates 141, 142, since they need only perform the function of holding the single crystal silicon thin films 111a, 111b via the insulating films 151, 152. As a result, the base substrates 141, 142 can be provided at low cost. Further, the single crystal silicon wafer 110 from which the single crystal silicon thin films 111a, 111b are removed in the detaching step can be reused in the manufacture of other SOI substrates 161, 162 by performing the flattening step for regeneration, thereby achieving efficient use of resources and further reduction in manufacturing cost.

Eighth Embodiment

FIGS. 15A–15L show an eighth preferred embodiment of the present invention, and points of the eighth embodiment differing from the seventh embodiment described above will now be described.

Figure 15A:
FIGS. 15A–15L are cross-sectional views schematically showing a manufacturing process for forming semiconductor substrates in a stepwise manner in an eighth preferred embodiment.
Figure 15B:
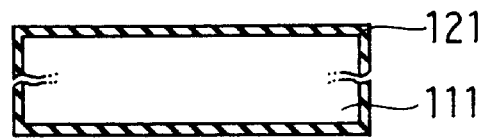
Figure 15C:
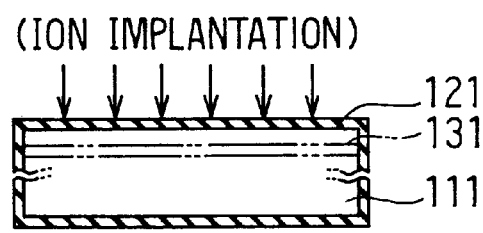

That is, in this embodiment, a preparing step shown in FIG. 15A, a protective film forming step shown in FIG. 15B and a first ion implanting step shown in FIG. 15C are carried out substantially in the same way as the preparing step, the protective film forming step and the first ion implanting step in the seventh embodiment as shown in FIGS. 14A–14C.

Figure 15D:
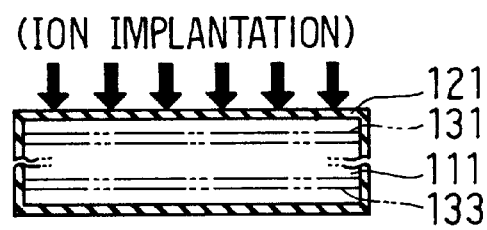

Then, in a second ion implanting step shown in FIG. 15D, hydrogen gas ions or noble gas ions are implanted into the single crystal silicon wafer 111 from the same side as in the first ion implanting step as shown with arrows in the drawings, so that a second ion-implanted layer 133 parallel with the lower surface, in the drawing, of the single crystal silicon wafer 111 is formed. The dose in the second ion implanting step is the same as that in the first ion implanting step. The ion implantation energy is raised to a level necessary to form the second ion-implanted layer 133 at a predetermined depth.

Figure 15E:
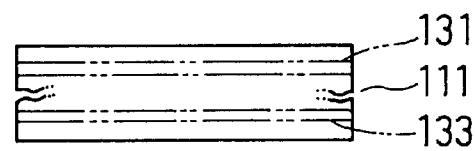
Figure 15F:
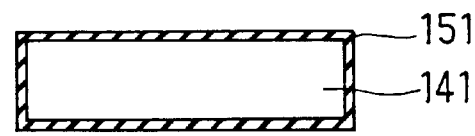
Figure 15G:
Figure 15H:
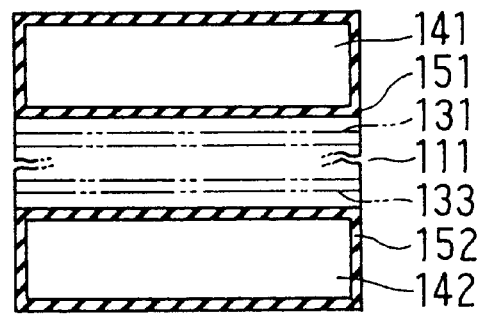
Figure 15I:
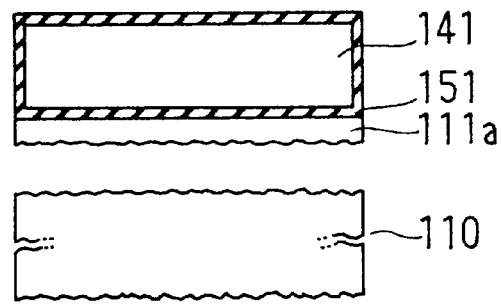
Figure 15J:
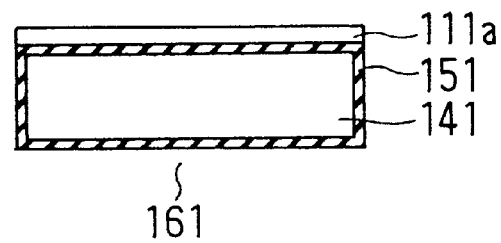
Figure 15K:
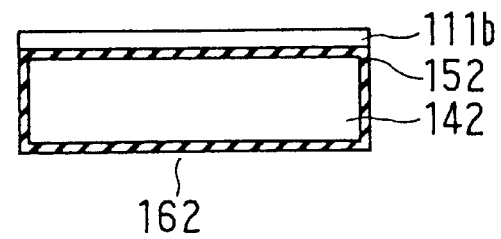
Figure 15L:

After that, a protective film removing step shown in FIG. 15E, an insulating film forming step shown in FIGS. 15F, 15G, a bonding step shown in FIG. 15H, a detaching step shown in FIG. 15I, a flattening step shown in FIGS. 15J, 15K, and a regenerating step shown in FIG. 15L are carried out substantially in the same way as those in the seventh preferred embodiment described with reference to FIGS. 14E–14L. By this means, two SOI substrates 161, 162 and a single crystal silicon wafer 110 to be reused are obtained.

In this embodiment, because in the first ion implanting step for forming the first ion-implanted layer 131 and the second ion implanting step for forming the second ion-implanted layer 133, the ion implantation can be carried out from the same side of the single crystal silicon wafer 111, it becomes unnecessary for the single crystal silicon wafer 111 to be inverted. As a result, the manufacturing process can be correspondingly simplified.

Although in the eighth embodiment, the ion implantation depths in the first and second ion implanting steps are controlled by changing the ion implantation energies, it is also possible for the ion implantation depths to be controlled by changing the constituent elements or molecular numbers of the ions implanted in the first and second ion implanting steps. That is, for a given ion implantation energy the smaller the mass of the implanted ions becomes, the deeper the ion implantation depth becomes. Accordingly, in the first ion implanting step the ion implantation depth can be set shallow by using for example argon ions or chlorine ions and in the second ion implanting step the ion implantation depth can be set deep by using for example hydrogen ions or helium ions. Even when only hydrogen ions are used, the ion implantation depths can be made to differ from each other by selectively using $H^+$ and $H_2^+$. Other effects of this eighth embodiment are the same as those of the seventh embodiment.

The aspect of the invention illustrated in the above-mentioned embodiments is not limited to these preferred embodiments, and for example the following modifications and extensions are possible.

The semiconductor substrate material may be one made by forming a single crystal silicon film on a single crystal silicon substrate by epitaxial growth or one made by forming a single crystal silicon film on a porous film by epitaxial growth. Further, although a single crystal silicon wafer is used as the semiconductor substrate material 111, any semiconductor material based on a group four element, for example Ge, SiC or SiGe can be used, or a polycrystalline silicon wafer or an epitaxial silicon layer grown on a porous-silicon layer can be used. Also, although the base substrates 141, 142 are formed using single crystal silicon wafers provided with insulating films 151, 152, the present invention is not limited to this and it is possible to use other semiconductor wafers, insulating ceramic substrates, or glass substrates. Further, it is apparent that seventh or eighth embodiments may be combined with the other embodiments described above.

What is claimed is:

1. A method of manufacturing a semiconductor substrate composed of a base substrate and a semiconductor layer disposed on the base substrate in an insulated state from the base substrate, the method comprising:

forming a contamination protective layer on a semiconductor substrate material;

formning an ion-implanted layer in the semiconductor substrate material by implanting ions through the contamination protective layer;

removing at least a part of the contamination protective layer from the semiconductor substrate material to secure a flat contamination-free surface;

providing hydrophilicity to the flat contamination-free surface and to a base substrate treatment surface of the base substrate;

directly bonding the semiconductor substrate material and the base substrate at the substrate material treatment surface and at the base substrate treatment surface;

detaching the semiconductor substrate material from the base substrate at the ion-implanted layer by a heat treatment, wherein in the removing at least the part of the contamination protective layer, only an upper part of the contamination protective layer is removed.

2. The method of claim 1, wherein the upper part of the contamination protective layer is removed by a method selected from a chemical etching method and a combined method of chemical etching and mechanical polishing.

3. The method of claim 1, wherein by the removing at least the part of the contamination protective layer, the surface of the contamination protective layer is flattened and contaminants embedded in the contamination protective layer by the forming the ion-implanted layer are removed.

4. A method of manufacturing a plurality of semiconductor substrates, each of which has a base substrate and a single crystal semiconductor layer disposed on the base substrate through an insulating layer, the method comprising:

forming a protective layer on a surface of a single crystal semiconductor substrate material;

forming a defective layer in the semiconductor substrate material through the protective layer covering the surface by ion implantation to define a single crystal thin film in a surface region of the semiconductor substrate material, the single crystal thin film to be the single crystal semiconductor layer of the semiconductor substrate;

preparing the base substrate having the insulating layer thereon, the base substrate having a quality inferior to that of the semiconductor substrate material;

bonding the base substrate to the single crystal thin film of the semiconductor substrate material with the insulating layer interposed therebetween;

detaching the semiconductor substrate material from the base substrate at the defective layer so that the semiconductor substrate composed of the base substrate and the single crystal semiconductor layer disposed on the base substrate through the insulating layer is provided; and reusing the semiconductor substrate material for forming another semiconductor substrate, wherein the protective layer is removed before the base substrate is bonded to the semiconductor substrate material.

5. The method of claim 4, wherein the reusing the semiconductor substrate material includes:

forming a covering layer made of one of an oxide material and a nitride material on a detachment surface of the semiconductor substrate material; and removing the covering layer from the semiconductor substrate material by etching.

6. The method of claim 4, wherein, the reusing the semiconductor substrate material includes:

bonding another substrate material to the semiconductor substrate material to form a spliced substrate material when a thickness of the semiconductor substrate material is equal to or smaller than a predetermined thickness; and using the spliced substrate material to form another semiconductor substrate.

7. A method of manufacturing a plurality of semiconductor substrates, each of which has a base substrate and a single crystal semiconductor layer disposed on the base substrate through an insulating layer, the method comprising:

forming a protective layer on a surface of a single crystal semiconductor substrate material;

forming a defective layer in the semiconductor substrate material through the protective layer covering the surface by ion implantation to define a single crystal thin film in a surface region of the semiconductor substrate material, the single crystal thin film to be the single crystal semiconductor layer of the semiconductor substrate;

preparing the base substrate having the insulating layer thereon, the base substrate having a quality inferior to that of the semiconductor substrate material;

bonding the base substrate to the single crystal thin film of the semiconductor substrate material with the insulating layer interposed therebetween;

detaching the semiconductor substrate material from the base substrate at the defective layer so that the semiconductor substrate composed of the base substrate and the single crystal semiconductor layer disposed on the base substrate through the insulating layer is provided; and reusing the semiconductor substrate material for forming another semiconductor substrate, wherein the protective layer is removed before the base substrate is bonded to the semiconductor substrate material further comprising steps of forming a trench in the semiconductor substrate material and filling the trench with a material before forming the defective layer, the trench having a depth deeper than that where the defective layer is to be formed.

8. A method of manufacturing a plurality of semiconductor substrates, each of which has a base substrate and a semiconductor layer disposed on the base substrate through an insulating layer, the method comprising:

selecting a donor substrate, the donor substrate comprising a semiconductor material and having a front side and a back side;

forming a protective layer on the front side and the back side of the donor substrate;

forming a first ion-implanted layer in the donor substrate at a first depth by ion-implantation through the protective layer on the front side of the donor substrate, the first ion-implanted layer defining a first semiconductor layer between the front surface and the first ion-implanted layer;

forming a second ion-implanted layer in the semiconductor substrate material at a second depth by ion-implantation performed through the protective layer on the back side of the donor substrate, the second ion-implanted layer defining a second semiconductor layer between the back side and the second ion-implanted layer;

removing the protective layer from the front side and the back side of the donor substrate;

bonding first and second base substrates to the first and second semiconductor layers of the semiconductor substrate material; and thermally treating the donor substrate to induce separation of the first and second semiconductor layers from a central portion of the donor substrate; and separating a first semiconductor substrate from the donor substrate, the first semiconductor substrate comprising the first base substrate and the first semiconductor layer, and separating a second semiconductor substrate from the donor substrate, the second semiconductor substrate comprising the second base substrate and the second semiconductor layer.

9. The method of claim 8, further comprising heating at least one of the first and second base substrates respectively holding the first and second semiconductor layers which are detached from the semiconductor substrate material, at a temperature higher than that of the heat treatment in the detaching the first and second base substrates.

10. The method of claim 10, wherein the heating at least one of the first and second base substrates increases a bonding strength between the one of the first and second base substrates and a corresponding one of the first and second semiconductor layers.

11. The method of claim 8, wherein:
in the forming the first ion-implanted layer, ions are implanted into the semiconductor substrate material from the first surface; and
in the forming the second ion-implanted layer, ions are implanted into the semiconductor substrate material from the second surface.

12. The method of claim 8, wherein the first and second ion-implnated layers are respectively formed at the first and second depths different from one another in the semiconductor substrate material by implanting ions from the same surface side.

13. The method of claim 12, wherein an ion implantation enregey for forming the first ion-implanted layer is different from that for forming the second ion-implanted layer.

14. The method of claim 12, wherein at least one of a combination of constituent elements and a molecular number of ions for forming the first ion-implanted layer is different from that for forming the second ion-implanted layer.

15. The method of claim 8, wherein:
the first and second base substrates respectively have first and second insulating layers thereon; and
the first and second base substrates are respectively bonded to the first and second semiconductor layers via the first and second insulating layers.

16. The method of claim 8, wherein the first protective layer and the second protective layer are made of an oxide material.

17. The method of claim 8, further comprising, before the first ion-implanted layer is formed, forming a contamination protective film on an entire surface of the semiconductor substrate material, the contamination protective film being composed of the first protective film covering the first surface, the second protective film covering the second surface, and a peripheral protective film covering a peripheral side surface of the semirconductor substrate material.

18. The method of claim 17, wherein the contamination protective film has a thickness in a range of about 50 nm to 100 nm.

19. The method of claim 4, wherein the protective layer is made of an oxide material.

20. A method of manufacturing a semiconductor substrate composed of a base substrate and a semiconductor layer disposed on the base substrate in an insulated state from the base substrate, the method comprising:

forming a contamination protective layer on a semiconductor substrate material;

forming an ion-implanted layer in the semiconductor substrate material by implanting ions through the contamination protective layer;

removing at least a part of the contamination protective layer from the semiconductor substrate material by etching to thereby expose an etched surface of the contamination protective layer;

flattening the etched surface to expose a treatment surface of the contamination protective layer;

directly bonding the semiconductor substrate material and the base substrate through the substrate material treatment surface; and detaching the semiconductor substrate material from the base substrate at the ion-implanted layer by a heat treatment.

21. The method of claim 20, wherein the etched surface is flattened by a method other than the etching.

22. The method of claim 21, wherein the etched surface is flattened by a chemical-mechanical polishing treatment.

23. The method of claim 20, wherein the contamination protective film is removed completely by flattening the etched surface.

* * * * *